US012660315B2

(12) United States Patent
Lu et al.

(10) Patent No.: US 12,660,315 B2
(45) Date of Patent: Jun. 16, 2026

(54) ARRAY SUBSTRATE, MANUFACTURING METHOD THEREFOR, LIGHT-EMITTING SUBSTRATE, AND DISPLAY DEVICE

(71) Applicant: BOE TECHNOLOGY GROUP CO., LTD., Beijing (CN)

(72) Inventors: Xinhong Lu, Beijing (CN); Zhanfeng Cao, Beijing (CN); Ke Wang, Beijing (CN); Jiushi Wang, Beijing (CN); Xiaoyan Zhu, Beijing (CN)

(73) Assignee: BOE TECHNOLOGY GROUP CO. , LTD., Beijing (CN)

( * ) Notice: Subject to any disclaimer, the term of this patent is extended or adjusted under 35 U.S.C. 154(b) by 696 days.

(21) Appl. No.: 17/765,355

(22) PCT Filed: Mar. 5, 2021

(86) PCT No.: PCT/CN2021/079376
§ 371 (c)(1),
(2) Date: Mar. 30, 2022

(87) PCT Pub. No.: WO2021/175320
PCT Pub. Date: Sep. 10, 2021

(65) Prior Publication Data
US 2022/0384492 A1      Dec. 1, 2022

(30) Foreign Application Priority Data

Mar. 5, 2020 (CN) .......................... 202010148099.5

(51) Int. Cl.
*H01L 27/12* (2006.01)
*H10D 86/01* (2025.01)
(Continued)

(52) U.S. Cl.
CPC .......... *H10D 86/60* (2025.01); *H10D 86/021* (2025.01); *H10D 86/441* (2025.01);
(Continued)

(58) Field of Classification Search
CPC ..... H01L 27/124; H10D 86/60; H10D 86/441
(Continued)

(56) References Cited

U.S. PATENT DOCUMENTS

2005/0110049 A1* 5/2005 Urushido ............. H05K 1/0281
257/202
2011/0050657 A1* 3/2011 Yamada ................. H10K 50/84
361/679.01

(Continued)

FOREIGN PATENT DOCUMENTS

CN      107195642 A      9/2017
CN      107331294 A      11/2017
(Continued)

OTHER PUBLICATIONS

English Machine Translation of CN 107331294. (Year: 2017).*

(Continued)

*Primary Examiner* — Dzung Tran
(74) *Attorney, Agent, or Firm* — XSENSUS LLP

(57) ABSTRACT

An array substrate having a light-emitting unit region, a bonding region, and a bending region located between the light-emitting unit region and the bonding region. The light-emitting unit region is configured to be provided with light-emitting units. The bonding region is configured to bond a control circuit. The array substrate includes a base substrate located in the light-emitting unit region and the bonding region, a first organic material layer, a metal intermediate layer, and a second organic material layer. The first organic material layer is disposed on a side of the base substrate. The metal intermediate layer is disposed on a side of the first organic material layer away from the base substrate. The second organic material layer is disposed on a side of the metal intermediate layer away from the base substrate.

17 Claims, 12 Drawing Sheets

(51) Int. Cl.
  *H10D 86/40*        (2025.01)
  *H10D 86/60*        (2025.01)
  *H10W 90/00*        (2026.01)

(52) U.S. Cl.
  CPC .......... *H10D 86/451* (2025.01); *H10W 90/00*
      (2026.01); *H10D 86/411* (2025.01)

(58) Field of Classification Search
  USPC ........................................................ 257/72
  See application file for complete search history.

(56)                References Cited

U.S. PATENT DOCUMENTS

| | | | | |
|---|---|---|---|---|
| 2013/0148312 | A1* | 6/2013 | Han ........................ | H05K 1/028 |
| | | | | 361/736 |
| 2014/0306348 | A1* | 10/2014 | Ahn ..................... | H05K 1/0281 |
| | | | | 257/773 |
| 2015/0115292 | A1* | 4/2015 | Jeon ....................... | H01L 27/124 |
| | | | | 257/88 |
| 2016/0035812 | A1* | 2/2016 | Kwon ................... | H10D 86/411 |
| | | | | 438/151 |
| 2018/0315951 | A1 | 11/2018 | Seong et al. | |
| 2019/0273124 | A1 | 9/2019 | Leng et al. | |
| 2019/0304958 | A1* | 10/2019 | Chen ........................ | G09G 3/32 |
| 2020/0020754 | A1* | 1/2020 | Kim ........................ | H10K 59/87 |
| 2020/0266367 | A1 | 8/2020 | Wang et al. | |

| | | | | |
|---|---|---|---|---|
| 2020/0295282 | A1 | 9/2020 | Xiang |
| 2020/0361197 | A1 | 11/2020 | Yang |
| 2021/0183981 | A1 | 6/2021 | Yang |
| 2021/0336166 | A1 | 10/2021 | Wen |

FOREIGN PATENT DOCUMENTS

| | | |
|---|---|---|
| CN | 107706220 A | 2/2018 |
| CN | 107728348 A | 2/2018 |
| CN | 107799538 A | 3/2018 |
| CN | 108389869 A | 8/2018 |
| CN | 108597378 A | 9/2018 |
| CN | 109256044 A | 1/2019 |
| CN | 109599422 A | 4/2019 |
| CN | 109671753 A | 4/2019 |
| CN | 109887935 A | 6/2019 |
| CN | 110085552 A | 8/2019 |
| CN | 110176184 A | 8/2019 |
| CN | 110503898 A | 11/2019 |
| CN | 110571239 A | 12/2019 |
| CN | 111081146 A | 4/2020 |
| CN | 111668275 A | 9/2020 |

OTHER PUBLICATIONS

Office Action for the Chinese Patent Application No. 202010148099.5 issued by the Chinese Patent Office on May 26, 2022.

* cited by examiner

01

210

202(200)

S10

S11

S12

S13

S23

100

100B~100

H1 {
L1
L2

H2 {

110~R
106~R
105
104
103
102

Z

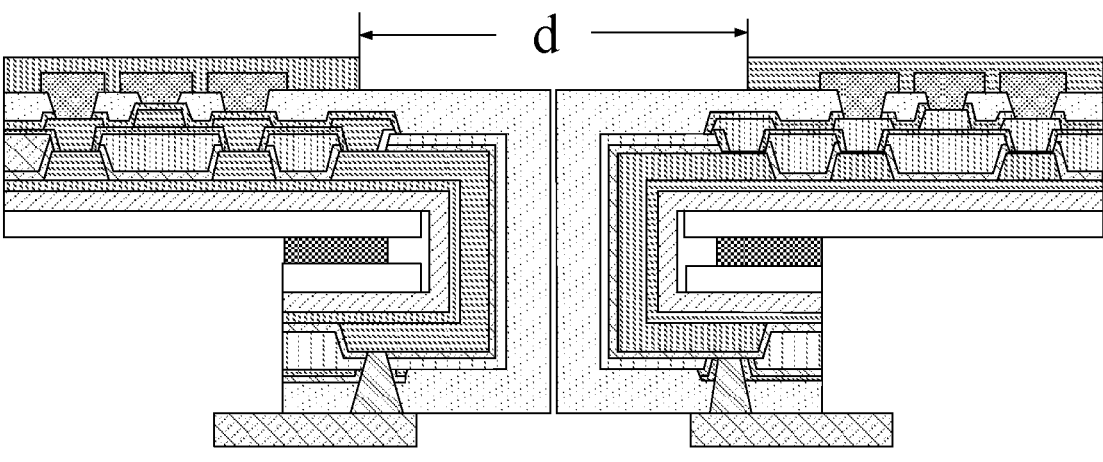

FIG. 10

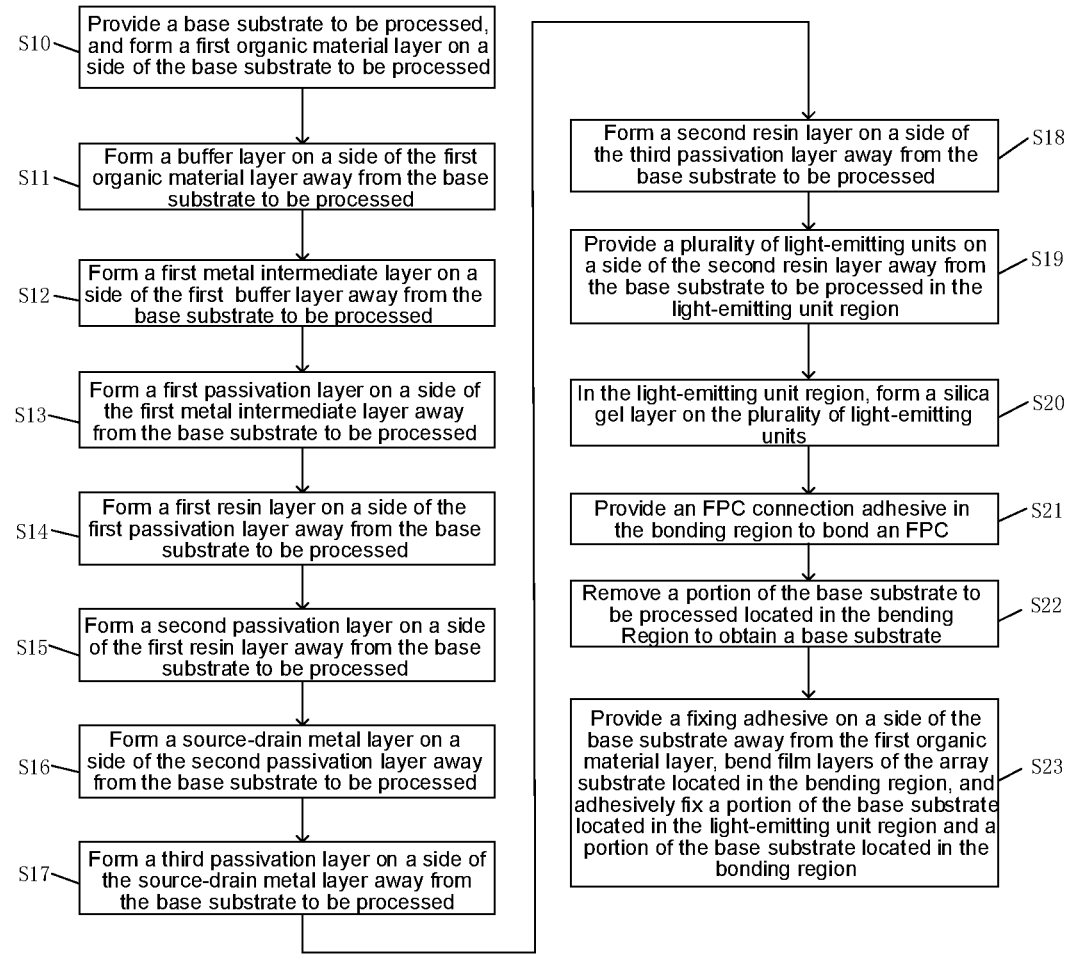

S10 — Provide a base substrate to be processed, and form a first organic material layer on a side of the base substrate to be processed S11 — Form a buffer layer on a side of the first organic material layer away from the base substrate to be processed S12 — Form a first metal intermediate layer on a side of the first buffer layer away from the base substrate to be processed S13 — Form a first passivation layer on a side of the first metal intermediate layer away from the base substrate to be processed S14 — Form a first resin layer on a side of the first passivation layer away from the base substrate to be processed S15 — Form a second passivation layer on a side of the first resin layer away from the base substrate to be processed S16 — Form a source-drain metal layer on a side of the second passivation layer away from the base substrate to be processed S17 — Form a third passivation layer on a side of the source-drain metal layer away from the base substrate to be processed S18 — Form a second resin layer on a side of the third passivation layer away from the base substrate to be processed S19 — Provide a plurality of light-emitting units on a side of the second resin layer away from the base substrate to be processed in the light-emitting unit region S20 — In the light-emitting unit region, form a silica gel layer on the plurality of light-emitting units S21 — Provide an FPC connection adhesive in the bonding region to bond an FPC S22 — Remove a portion of the base substrate to be processed located in the bending Region to obtain a base substrate S23 — Provide a fixing adhesive on a side of the base substrate away from the first organic material layer, bend film layers of the array substrate located in the bending region, and adhesively fix a portion of the base substrate located in the light-emitting unit region and a portion of the base substrate located in the bonding region

FIG. 11

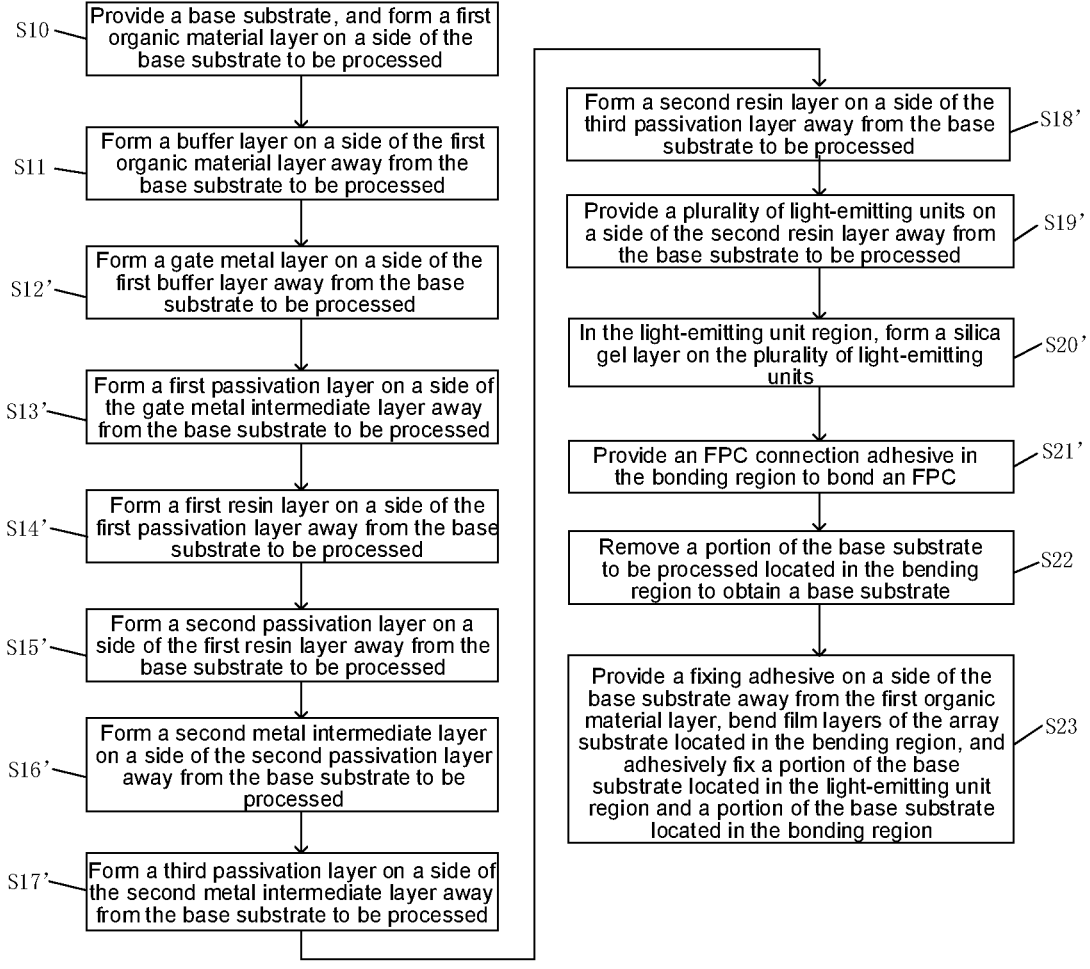

S10 — Provide a base substrate, and form a first organic material layer on a side of the base substrate to be processed S11 — Form a buffer layer on a side of the first organic material layer away from the base substrate to be processed S12' — Form a gate metal layer on a side of the first buffer layer away from the base substrate to be processed S13' — Form a first passivation layer on a side of the gate metal intermediate layer away from the base substrate to be processed S14' — Form a first resin layer on a side of the first passivation layer away from the base substrate to be processed S15' — Form a second passivation layer on a side of the first resin layer away from the base substrate to be processed S16' — Form a second metal intermediate layer on a side of the second passivation layer away from the base substrate to be processed S17' — Form a third passivation layer on a side of the second metal intermediate layer away from the base substrate to be processed S18' — Form a second resin layer on a side of the third passivation layer away from the base substrate to be processed S19' — Provide a plurality of light-emitting units on a side of the second resin layer away from the base substrate to be processed S20' — In the light-emitting unit region, form a silica gel layer on the plurality of light-emitting units S21' — Provide an FPC connection adhesive in the bonding region to bond an FPC S22 — Remove a portion of the base substrate to be processed located in the bending region to obtain a base substrate S23 — Provide a fixing adhesive on a side of the base substrate away from the first organic material layer, bend film layers of the array substrate located in the bending region, and adhesively fix a portion of the base substrate located in the light-emitting unit region and a portion of the base substrate located in the bonding region

FIG. 15

ARRAY SUBSTRATE, MANUFACTURING METHOD THEREFOR, LIGHT-EMITTING SUBSTRATE, AND DISPLAY DEVICE

CROSS-REFERENCE TO RELATED APPLICATIONS

The present disclosure is a national phase entry under 35 USC 371 of International Patent Application No. PCT/CN2021/079376 filed on Mar. 5, 2021, which claims priority to Chinese Patent Application No. 202010148099.5, filed on Mar. 5, 2020, which are incorporated herein by reference in their entirety.

TECHNICAL FIELD

The present disclosure relates to the field of display technologies, and in particular, to an array substrate and a manufacturing method therefor, a light-emitting substrate and a display device.

BACKGROUND

Light-emitting diode (LED) chips, including micro LED chips and mini LED chips, emerge after liquid crystal display (LCD) devices to adapt to the development trend of thinness and lightness of display devices.

The micro LED chips are applied to the display devices, and have advantages that the tile of display substrates can be achieved, and the image display of a super-large display panel can be achieved by using a certain number of small-sized display substrates. The size of the micro LED chip is approximately below 100 μm, which is 1% of the size of the conventional LED chip. The micro-sized micro LED chips/mini LED chips is transferred onto the display substrate through the mass transfer technology to form a variety of micro LED/mini LED display devices with various sizes.

SUMMARY

In an aspect, an array substrate is provided. The array substrate has a light-emitting unit region, a bonding region, and a bending region located between the light-emitting unit region and the bonding region. The light-emitting unit region is configured to be provided with light-emitting units. The bonding region is configured to bond a control circuit.

The array substrate includes a base substrate located in the light-emitting unit region and the bonding region, a first organic material layer, a metal intermediate layer, and a second organic material layer. The first organic material layer is disposed on a side of the base substrate. The metal intermediate layer is disposed on a side of the first organic material layer away from the base substrate. The second organic material layer is disposed on a side of the metal intermediate layer away from the base substrate.

In some embodiments, the base substrate is made of a rigid material.

In some embodiments, the light-emitting unit region is provided with at least one thin film transistor therein. A thin film transistor includes a source, a drain, and a gate. The metal intermediate layer includes a first metal intermediate layer and/or a second metal intermediate layer. The first metal intermediate layer includes the gate of the thin film transistor, and a first electrical structure located at least in the bending region, and the second metal intermediate layer includes the source and the drain of the thin film transistor, and a second electrical structure located at least in the bending region.

In some embodiments, the metal intermediate layer includes the first metal intermediate layer including the gate of the thin film transistor and the first electrical structure located at least in the bending region, and the first electrical structure includes a portion located in the light-emitting unit region, a portion located in the bending region, and a portion located in the bonding region.

In some embodiments, the portion included in the first electrical structure that is located in the light-emitting unit region includes a portion of a gate line located in the light-emitting unit region or a portion of a power supply line located in the light-emitting unit region, and the portions included in the first electrical structure that are located in the bending region and the bonding region include portions of a first fan-out line located in the bending region and the bonding region.

In some embodiments, the metal intermediate layer includes the second metal intermediate layer including the source and the drain of the thin film transistor, and the second electrical structure located at least in the bending region, and the second electrical structure includes a portion located in the light-emitting unit region, a portion located in the bending region, and a portion located in the bonding region.

In some embodiments, the portion included in the second electrical structure that is located in the light-emitting unit region includes a portion of a data line located in the light-emitting unit region or a portion of a power supply line located in the light-emitting unit region, and the portions included in the second electrical structure that are located in the bending region and the bonding region include portions of a second fan-out line located in the bending region and the bonding region.

In some embodiments, the array substrate further includes a first protection layer and a second protection layer. The first protection layer is located between the metal intermediate layer and the first organic material layer, and the second protection layer is located between the metal intermediate layer and the second organic material layer.

In some embodiments, the light-emitting unit region is provided with at least one thin film transistor therein, and a thin film transistor includes a source, a drain, and a gate. The metal intermediate layer includes a first metal intermediate layer including the gate of the thin film transistor, and a first electrical structure located at least in the bending region. The first protection layer includes a buffer layer, and the second protection layer includes a first passivation layer. The gate of the thin film transistor and a portion of the first electrical structure located in the bending region are disposed between the buffer layer and the first passivation layer.

The array substrate further includes a first resin layer, a second passivation layer, a third passivation layer, and a second resin layer. The first resin layer is disposed on a side of the first passivation layer away from the base substrate, and the first resin layer includes a portion located in the light-emitting unit region, a portion located in the bending region, and a portion located in the bonding region. The second passivation layer is disposed on a side of the first resin layer away from the base substrate, and the second passivation layer includes a portion located in the light-emitting unit region and a portion located in the bonding region. The source and the drain of the thin film transistor are disposed on a side of the second passivation layer away from the base substrate. The third passivation layer is disposed on the side of the second passivation layer away from the base substrate, and the third passivation layer includes a portion located in the light-emitting unit region and a portion located in the bonding region. The second resin layer is disposed on a side of the third passivation layer away from the base substrate, and the second resin layer includes a portion located in the light-emitting unit region, a portion located in the bending region, and a portion located in the bonding region. The portion of the second resin layer located in the bending region is in contact with the portion of the first resin layer located in the bending region. The second organic material layer is the second resin layer or a combination of the first resin layer and the second resin layer.

In some embodiments, the light-emitting unit region is provided with at least one thin film transistor therein, and a thin film transistor includes a source, a drain, and a gate. The metal intermediate layer includes a second metal intermediate layer including the source and the drain of the thin film transistor, and a second electrical structure located at least in the bending region. The first protection layer includes a second passivation layer, and the second protection layer includes a third passivation layer. The source and the drain of the thin film transistor and a portion of the second electrical structure located in the bending region are disposed between the second passivation layer and the third passivation layer.

The array substrate further includes a buffer layer, the gate of the thin film transistor, a first passivation layer, a first resin layer, and a second resin layer. The buffer layer is disposed between the first organic material layer and the second passivation layer. The gate of the thin film transistor is disposed on a side of the buffer layer away from the base substrate. The first passivation layer is disposed on a side of the gate of the thin film transistor away from the buffer layer, and includes a portion located in the light-emitting unit region. The first resin layer is disposed on a side of the first passivation layer away from the buffer layer, and includes a portion located in the light-emitting unit region, a portion located in the bending region, and a portion located in the bonding region. The portion of the first resin layer located in the bending region is in contact with the buffer layer. The second passivation layer is disposed on a side of the first resin layer away from the base substrate, and includes a portion located in the light-emitting unit region and a portion located in the bending region. The third passivation layer includes a portion located in the light-emitting unit region and a portion located in the bending region. The second resin layer is disposed on a side of the third passivation layer away from the base substrate. The second organic material layer is the second resin layer.

In some embodiments, in the bending region, a thickness of the first organic material layer in a direction perpendicular to a plane where the base substrate is located is approximately equal to a thickness of the second organic material layer in the direction perpendicular to the plane where the base substrate is located.

In some embodiments, in the bending region, a percentage difference between a sum of thicknesses of layers on one side of the metal intermediate layer in a direction perpendicular to a plane where the base substrate is located and a sum of thicknesses of layers on another side of the metal intermediate layer in the direction perpendicular to the plane where the base substrate is located is less 30%.

In some embodiments, the array substrate further includes a fixing adhesive. The fixing adhesive is disposed on a side of the base substrate away from the first organic material layer. In a case where film layers of the array substrate located in the bending region is bent, the fixing adhesive is configured to adhesively fix a portion of the base substrate located in the light-emitting unit region and a portion of the base substrate located in the bonding region.

In another aspect, a manufacturing method for an array substrate is provided. The array substrate has a light-emitting unit region, a bonding region, and a bending region located between the light-emitting unit region and the bonding region. The light-emitting unit region is configured to be provided with light-emitting units. The bonding region is configured to bond a control circuit.

The manufacturing method for the array substrate includes: providing a base substrate to be processed; forming a first organic material layer on a side of the base substrate to be processed; forming a metal intermediate layer on a side of the first organic material layer away from the base substrate to be processed; forming a second organic material layer on a side of the metal intermediate layer away from the base substrate to be processed; and removing a portion of the base substrate to be processed located in the bending region to obtain a base substrate.

In some embodiments, before forming the metal intermediate layer on the side of the first organic material layer away from the base substrate to be processed, the manufacturing method for the array substrate further includes: forming a first protection layer on a side of the first organic material layer away from the base substrate to be processed.

Before forming the second organic material layer on the side of the metal intermediate layer away from the base substrate to be processed, the manufacturing method for the array substrate further includes: forming a second protection layer on a side of the metal intermediate layer away from the base substrate to be processed.

In some embodiments, the light-emitting unit region is provided with at least one thin film transistor therein. Forming the metal intermediate layer on the side of the first organic material layer away from the base substrate to be processed includes: forming a first metal intermediate layer on the side of the first organic material layer away from the base substrate to be processed, and/or, forming a second metal intermediate layer on the side of the first organic material layer away from the base substrate to be processed. The first metal intermediate layer includes a gate of a thin film transistor and a first electrical structure. The second metal intermediate layer includes a source and a drain of the thin film transistor and a second electrical structure. The first electrical structure includes a portion located in the light-emitting unit region, a portion located in the bending region, and a portion located in the bonding region. The second electrical structure includes a portion located in the light-emitting unit region, a portion located in the bending region, and a portion located in the bonding region.

In some embodiments, the manufacturing method for the array substrate further includes: providing a fixing adhesive on a side of the base substrate away from the first organic material layer; bending film layers of the array substrate located in the bending region; and adhesively fixing a portion of the base substrate located in the light-emitting unit region and a portion of the base substrate located in the bonding region.

In yet another aspect, a light-emitting substrate is provided. The light-emitting substrate includes the array substrate as described in any of the above embodiments, and a plurality of light-emitting units provided on the array substrate. The plurality of light-emitting units are located in the light-emitting unit region and on a side of the second organic material layer away from the base substrate.

In some embodiments, the light-emitting units include micro light-emitting diode chips.

In yet another aspect, a display device is provided. The display device includes the light-emitting substrate as described in any of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

FIGS. 5-1 to 5-15 are step diagrams of a manufacturing method for an array substrate, in accordance with some embodiments;

FIG. 6 is a structural diagram of a bending region of an array substrate, in accordance with some embodiments;

FIG. 7 is a top view of the array substrate provided in FIG. 5-15;

FIG. 8 is another top view of the array substrate provided in FIG. 5-15;

FIG. 9 is a back view of an array substrate after bending, in accordance with some embodiments;

FIG. 10 is a tile process of an array substrate, in accordance with some embodiments;

FIG. 11 is a flow diagram of manufacturing an array substrate, in accordance with some embodiments;

FIG. 12 is a structural diagram of another array substrate, in accordance with some embodiments;

FIG. 13 is a structural diagram of another bending region of an array substrate, in accordance with some embodiments;

FIG. 14 is a structural diagram of yet another bending region of an array substrate, in accordance with some embodiments; and FIG. 15 is a flow diagram of manufacturing another array substrate, in accordance with some other embodiments.

DETAILED DESCRIPTION

Figures 1, 2:
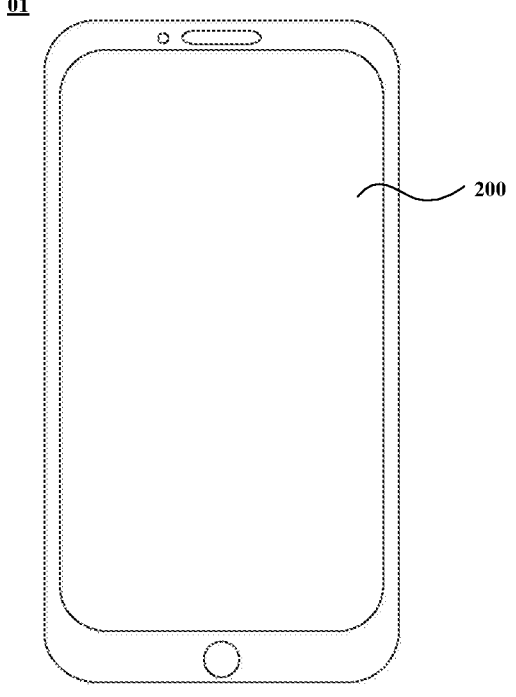
FIG. 1 is a structural diagram of a display device, in accordance with some embodiments.
FIG. 2 is a structural diagram of another display device, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Below, the terms "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

Some embodiments may be described using the expression "coupled" and "connected" along with derivatives thereof. For example, the term "connected" may be used in the description of some embodiments to indicate that two or more components are in direct physical or electrical contact with each other. As another example, the term "coupled" may be used in the description of some embodiments to indicate that two or more components are in direct physical or electrical contact. However, the term "coupled" or "communicatively coupled" may also mean that two or more components are not in direct contact with each other but still cooperate or interact with each other. The embodiments disclosed herein are not necessarily limited to the content herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The use of the phrase "applicable to" or "configured to" herein means an open and inclusive expression, which does not exclude devices that are applicable to or configured to perform additional tasks or steps.

Additionally, the use of "based on" is meant to be open and inclusive, in that a process, step, calculation, or other action "based on" one or more recited conditions or values may, in practice, be based on additional conditions or value beyond those recited.

Terms such as "about" or "approximately" as used herein includes a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

Exemplary embodiments are described herein with reference to cross-sectional views and/or plan views as idealized exemplary drawings. In the accompanying drawings, thicknesses of layers and sizes of regions are enlarged for clarity. Variations in shapes with respect to the drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

It will be noted that the embodiments in the present disclosure and the characteristics in the embodiments may be combined with each other in the case of no conflict. The present disclosure will be described in detail below with reference to the accompanying drawings and in combination with the embodiments.

Some embodiments of the present disclosure provide a display device. The display device may be, for example, a mobile phone, a tablet computer, a personal digital assistant (PDA), a vehicle-mounted computer, and a wearable display device such as a watch. A specific form of the display device is not particularly limited in the embodiments of the present disclosure.

As shown in FIG. 1, the display device 01 usually includes, for example, a light-emitting substrate 200. In some examples, the light-emitting substrate 200 may be a display substrate or a backlight substrate. In a case where the display device 01 is an active light-emitting display device, for example, the display device 01 is a micro LED display device or a mini LED display device, the light-emitting substrate 200 is the display substrate, and the display substrate is configured to display an image. In a case where the display device 01 is a passive light-emitting display device, for example, as shown in FIG. 2, the display device 01 is an LCD display device, and the light-emitting substrate 200 is the backlight substrate 202, the display device 01 further includes a liquid crystal display panel 210. The backlight substrate 202 is configured to provide a light source for the liquid crystal display panel 210 to enable the liquid crystal display panel 210 to display an image.

In some embodiments, the light-emitting substrate 200 includes an array substrate and a plurality of light-emitting units disposed on the array substrate. The light-emitting unit includes LED chips, and the LED chips include, for example, micro LED chips and mini LED chips.

In a case where the light-emitting substrate 200 adopting the micro LED chips is used as the backlight substrate 202, the light-emitting substrate 200 is usually used as a backlight source of the LCD display device. Since the micro LED chips can control brightness and darkness of micro regions of a display area, so that a contrast of the displayed image of the LCD display device can reach or even exceed that of an organic light-emitting diode (OLED) display device.

Figure 3:
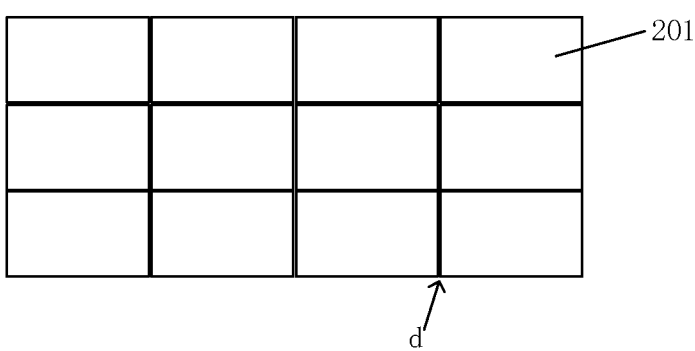
FIG. 3 is a schematic diagram showing tile of display substrates, in accordance with some embodiments.

In a case where the light-emitting substrate 200 adopting the micro LED chips is used as the display substrate 201, the light-emitting substrate 200 is mostly applied to a display device 01 tiled by a plurality of display substrates 201, so that the display device 01 using the display substrates 201 displays an image with a relatively large size after tiling. When a plurality of micro LED display substrates are tiled, as shown in FIG. 3, there is a tile seam d between adjacent micro LED display substrates 201. That eliminating the tile seam d as much as possible to improve a display effect of a display device with a super-large screen is a direction of optimization research by those skilled in the art.

Currently, a through-plastic-via (TPV) solution, a side wiring solution, and a sidewall deposition solution are usually adopted to reduce a width of the tile seam. For example, in the TPV solution, the adopted array substrate includes a base, various film layers on one side of the base, and a bonding pad and an integrated circuit (IC) chip or a chip on film (COF) or a flexible printed circuit (FPC), that are connected to the bonding PAD, that are located on the other side of the base. The base is usually made of polyimide (PI) to achieve a flexible bending effect. In the TPV solution, the adopted array substrate is formed by a single-sided process, and there is no need to add side wirings, so that the process cost is low; a width of a single side of the array substrate after bending is approximately 85 μm. However, approximately 12 to 13 masks are required to form patterns of the film layers on the side of the base in the TPV solution, moreover, due to a property of the base made of the PI material, it is difficult to manufacture the bonding pad and the IC or COF or FPC on the back side of the base and realize an electrical connection thereof.

In the side wiring solution, the adopted array substrate includes a base, various film layers located on one side of the base, and a bonding pad and an IC or COF or FPC, that are connected to the bonding pad, that are located on the other side of the base. The base is made of a rigid material, and the bonding pad on the other side of the base is manufactured by a backside wiring process, and then a conductive material is covered on sides of the base to electrically connect signal lines on the one side and the other side of the base. That is, in the side wiring solution, the adopted array substrate is formed by a double-sided process, and side wirings need to be manufactured. In addition, in the side wiring solution, approximately 16 masks are required to form patterns of the film layers on the one side of the base, so that the process cost is relatively high. A width of a single side of the array substrate formed by the side wiring solution is approximately 155 μm after bending.

In the sidewall deposition solution, a manufacturing process is similar to a manufacturing process of the side wiring solution, on the basis of adopting a rigid master base, a backside wiring process is performed to manufacture the bonding PAD on the other side of the master base. Then, the master is cut into small substrates, and sidewall metal line deposition is performed on the small substrates. It will be understood that the coverage of the sidewall metal line deposition is extremely poor, and therefore, an extremely long-time sputtering process is required to achieve a thickness of a signal line of a same level as a size of the mini LED chip. In this way, it is easy to cause deformed fragments of the small substrates, and the manufacturing process is difficult. In addition, in the manufacturing process adopting the sidewall deposition solution, a process of manufacturing the sidewall metal lines on the cut small substrates is cumbersome. After the sidewall metal line is deposited, a protective adhesive is made on both sides of the base, and there is a relatively high risk of over-etching, which is not conducive to extensive promotion. The substrate manufactured by the sidewall deposition solution needs to be reprocessed and combined, so that the cost is relatively high; and moreover, an alignment accuracy with other combined structures is difficult to control, which is not beneficial to achieve high pixels per inch (PPD.

Based on the above, some embodiments of the present disclosure provide an array substrate, which can solve at least one of the above problems, realize seamless tile of the light-emitting substrates which the array substrate after bending applied thereto, and reduce a process difficulty. As shown in FIGS. 4, 5-15, 7 and 8, the array substrate 100 in the embodiments of the present disclosure has a light-emitting unit region 100A, a bonding region 100C, and a bending region 100B located between the light-emitting unit region 100A and the bonding region 100C.

Figure 4:
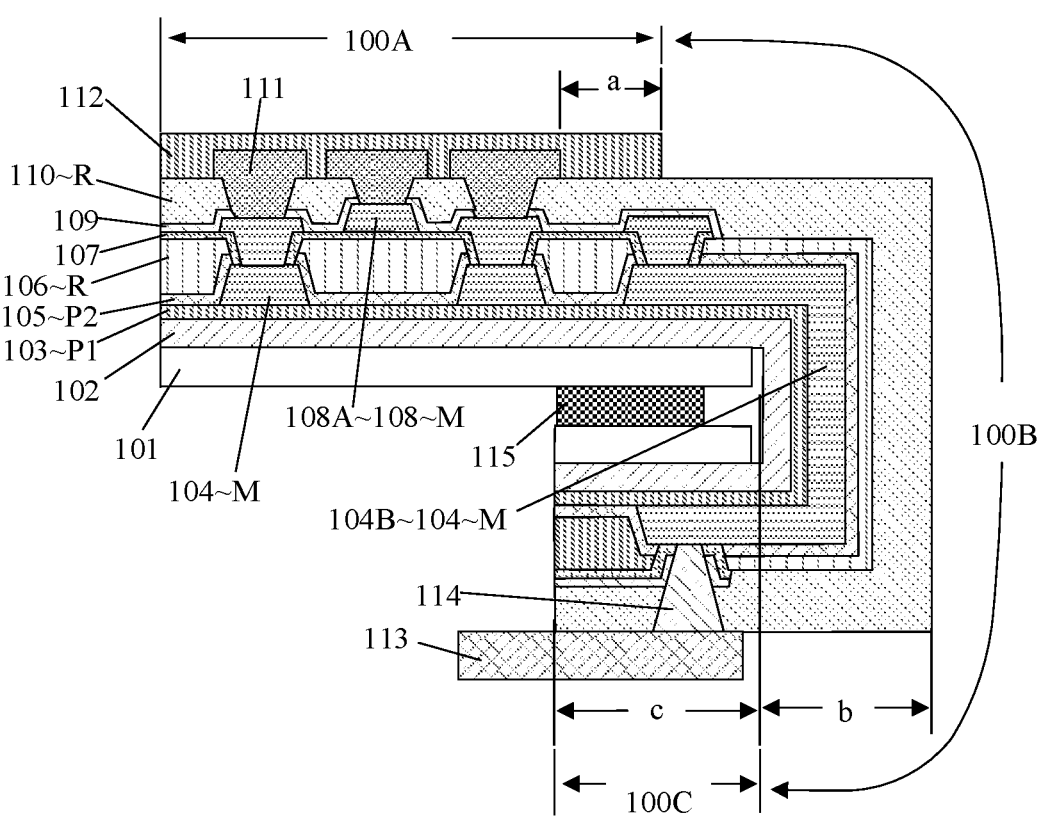
FIG. 4 is a partial structural diagram of an array substrate, in accordance with some embodiments.

As shown in FIG. 4, in a case where the array substrate 100 is used in the display substrate 201, the light-emitting unit region 100A is an effective display unit region. That is, the light-emitting unit region 100A is located in a display area of the light-emitting substrate. The bending region 100B and the bonding region 100C are located in a peripheral area of the light-emitting substrate. The light-emitting unit region 100A is configured to be provided with a plurality of light-emitting units 111 therein, and the bonding region 100C is configured to bond a control circuit.

In a case where the array substrate 100 is used as a backlight substrate, the light-emitting unit region 100A is a backlight source region.

The light-emitting unit region 100A is configured to be provided with a plurality of light-emitting units 111 therein, and the bonding region 100C is configured to bond the control circuit.

Figures 1, 5:
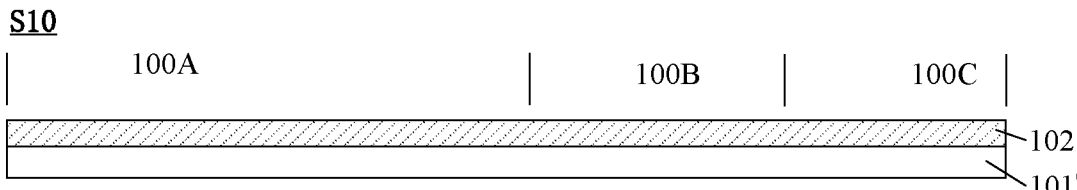
Figures 2, 5:
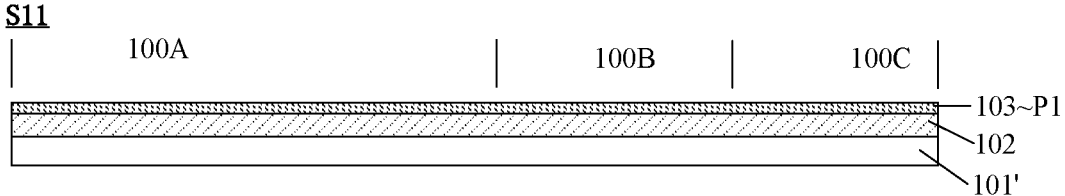
Figures 3, 5:
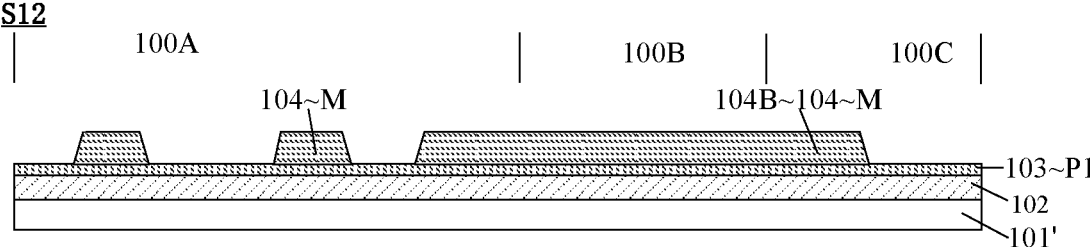
Figures 4, 5:
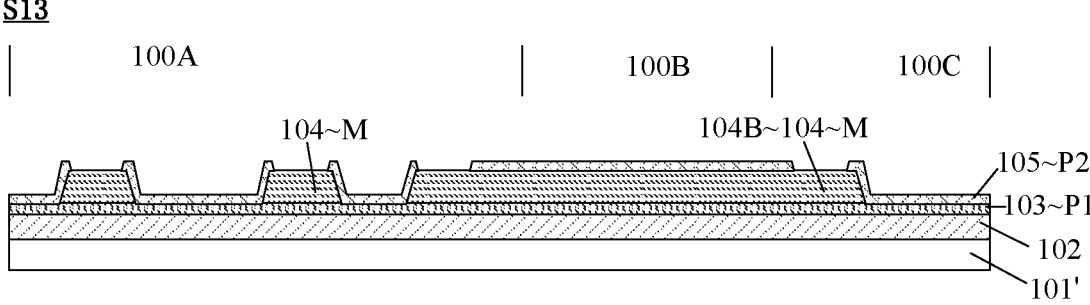
Figure 5:
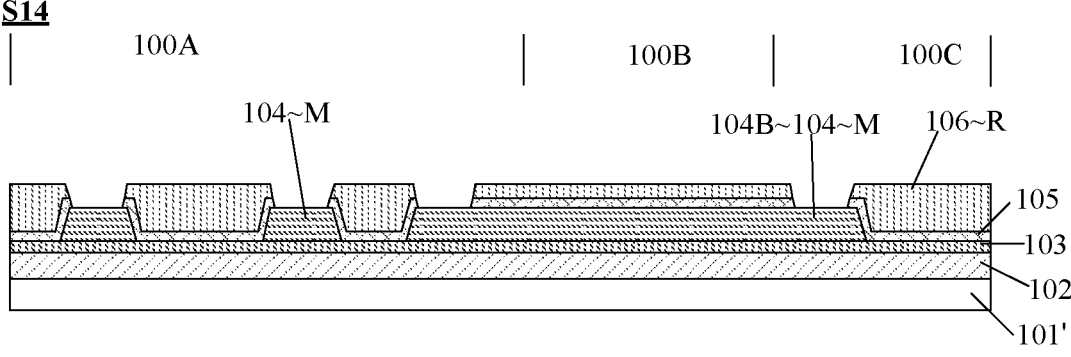
Figures 5, 6:
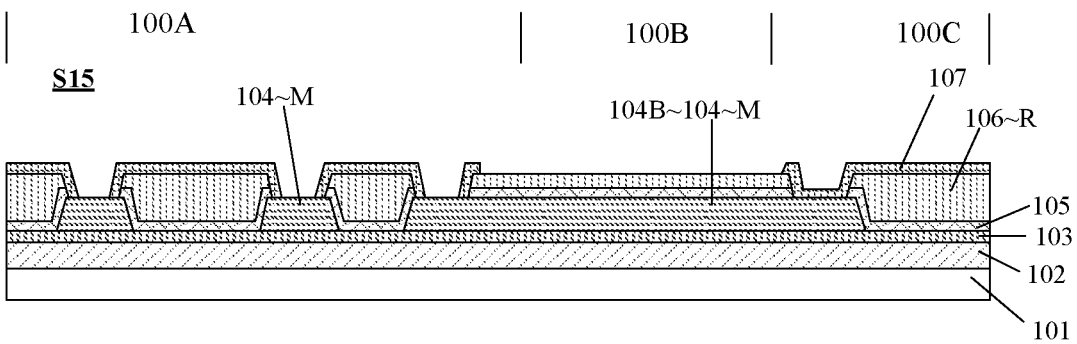
Figures 5, 6, 7:
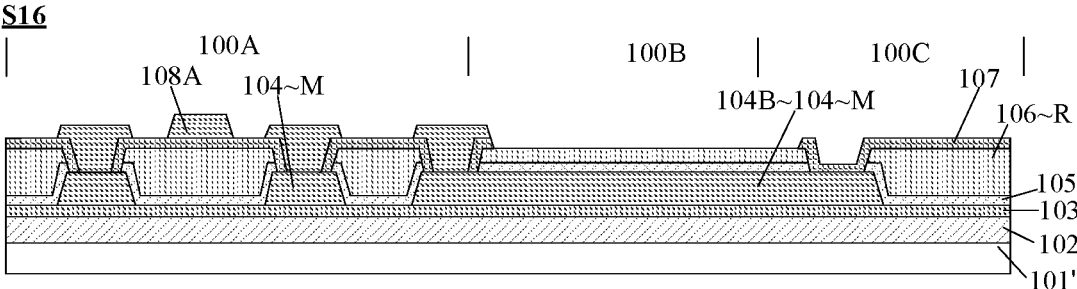
Figures 5, 6, 7, 8:
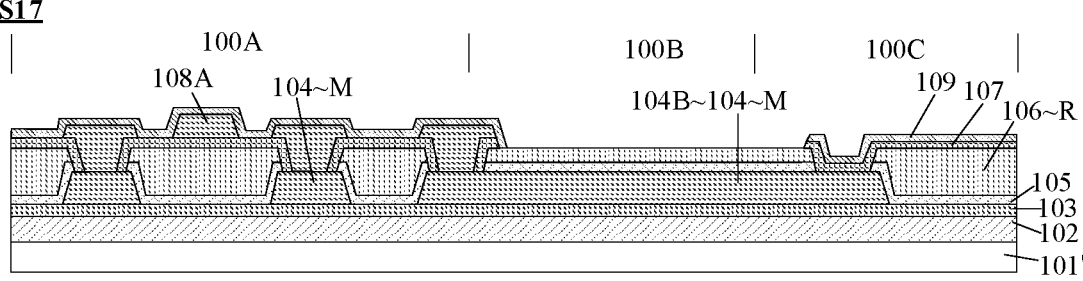

It will be understood that, in a case where the array substrate 100 is used as a display substrate, as shown in FIGS. 7 and 8, the peripheral area of the display substrate 201 is provided with display driving circuits including a source driving circuit SD and a gate driving circuit GD. The source driving circuit SD is connected to a plurality of data lines DL. The gate driving circuit GD is connected to a plurality of gate lines GL.

In some examples, as shown in FIGS. 7 and 8, the array substrate 100 includes a plurality of power supply lines, the plurality of gate lines, and the plurality of data lines that are disposed in the light-emitting unit region 100A. The plurality of gate lines are electrically connected to the gate driving circuit, and are configured to transmit gate signals to the plurality of light-emitting units 111. The plurality of data lines are electrically connected to the source driving circuit, and are configured to transmit data signals to the plurality of light-emitting units 111. For example, the array substrate 100 further includes a plurality of fan-out lines. For example, the plurality of fan-out lines are disposed in the bonding region 100C and the bending region 1006, and include a plurality of first fan-out lines and a plurality of second fan-out lines. The plurality of gate lines are electrically connected to the gate driving circuit through the plurality of first fan-out lines, and the plurality of data lines are electrically connected to the source driving circuit through the plurality of second fan-out lines.

For example, as shown in FIGS. 7 and 8, the bending region 100B includes a first bending region W1 and a second bending region W2. The first bending region W1 is located at a position of the peripheral area proximate to the source driving circuit. The second bending region W2 is located at a position of the peripheral area proximate to the gate driving circuit.

In some embodiments, as shown in FIG. 4, the array substrate 100 includes a base substrate 101, a first organic material layer 102, a metal intermediate layer M, and a second organic material layer R. The base substrate 101 is located in the light-emitting unit region 100A and the bonding region 100C. The first organic material layer 102 is disposed on a side of the base substrate 101. The metal intermediate layer M is disposed on a side of the first organic material layer 102 away from the base substrate 101. The second organic material layer R is disposed on a side of the metal intermediate layer M away from the base substrate 101.

Thicknesses of the first organic material layer 102 and the second organic material layer R on both sides of the metal intermediate layer M are relatively large. Therefore, in the array substrate 100 with above structure, the metal intermediate layer M is disposed in the middle of film layers of the array substrate 100 in the bending region 1008 by controlling structures and positional relationships of the film layers. As a result, structures of the film layers in the bending region 100B are reasonable, the generated bending stress is small, and a service life of a product is improved. Moreover, since the structures of the film layers in the bending region 100B are simple, a width of the single side of the array substrate 100 after bending is small, which reduces a width of a seam between every two adjacent array substrates 100 after the array substrates 100 are applied to a tiled display device. Compared with the TPV solution, the side wiring solution, and the sidewall deposition solution, a manufacturing process difficulty in the embodiments of the present disclosure is greatly reduced, which is beneficial to improve a manufacturing yield of the array substrate 100 and make the array substrate 100 more widely used.

In some embodiments, in the array substrate 100, the base substrate 101 is made of a rigid material. For example, the rigid material may be, for example, one of quartz, glass, silicon dioxide, silicon, plastic, or polymethyl methacrylate.

The first organic material layer 102 is usually made of polyimide (PI).

The second organic material layer R is usually made of organic resin. It will be noted that, as shown in FIGS. 4, 5-15 and 12, the second organic material layer R includes a first resin layer 106 and/or a second resin layer 110.

In some embodiments, the metal intermediate layer M has a single-layer structure, and a material thereof is a metal element or a metal alloy, such as copper (Cu) or molybdenum-nickel-titanium alloy (MTD). Alternatively, the metal intermediate layer M has a two-layer or multi-layer structure. For example, for the metal intermediate layer M with a three-layer structure (MTD/Cu/MTD) in which the molybdenum-nickel-titanium alloy is disposed on both sides of the copper, and a thickness of Cu is 6500 angstroms, and thicknesses of MTD disposed on both sides of Cu are 300 angstroms and 200 angstroms, respectively. In this way, the internal stress of the metal intermediate layer M with the multi-layer structure is relatively small.

In some embodiments, the light-emitting unit region 100A is provided with at least one thin film transistor therein. The thin film transistor includes a source, a drain, and a gate.

As shown in FIGS. 4, 5-15 and 12, the metal intermediate layer M includes a first metal intermediate layer 104 and/or a second metal intermediate layer 108.

In some examples, as shown in FIG. 4, the first metal intermediate layer 104 includes the gate of the thin film transistor and a first electrical structure 1046 located at least in the bending region 1006. For example, the first metal intermediate layer 104 is a gate metal layer.

For example, as shown in FIG. 4, the first electrical structure 104B includes a portion located in the light-emitting unit region 100A, a portion located in the bending region 1008, and a portion located in the bonding region 100C. That is, the first electrical structure 104B extends across the light-emitting unit region 100A, the bending region 1008, and the bonding region 100C.

For example, the first electrical structure 1048 includes one or more of a portion of the gate line located in the light-emitting unit region 100A, a portion of the power supply line located in the light-emitting unit region 100A, and a portion of the first fan-out line located in the bending region 100B and the bonding region 100C. For example, the portion included in the first electrical structure 104B that is located in the light-emitting unit region 100A is the portion of the gate line, and the portions included in the first electrical structure 104B that are located in the bending region 100B and the bonding region 100C are portions of the first fan-out line.

The portion of the first fan-out lines located in the bending region 100B and the bonding region 100C are used to electrically connect the portion of the electrical structure in the light-emitting unit region 100A and pin terminals in the bonding region 100C.

Figures 5, 6, 7, 8, 9:
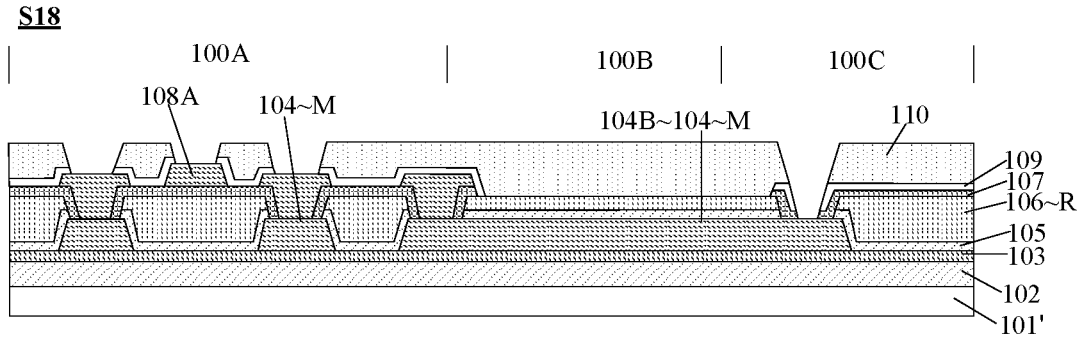
Figures 5, 6, 7, 8, 9, 10:
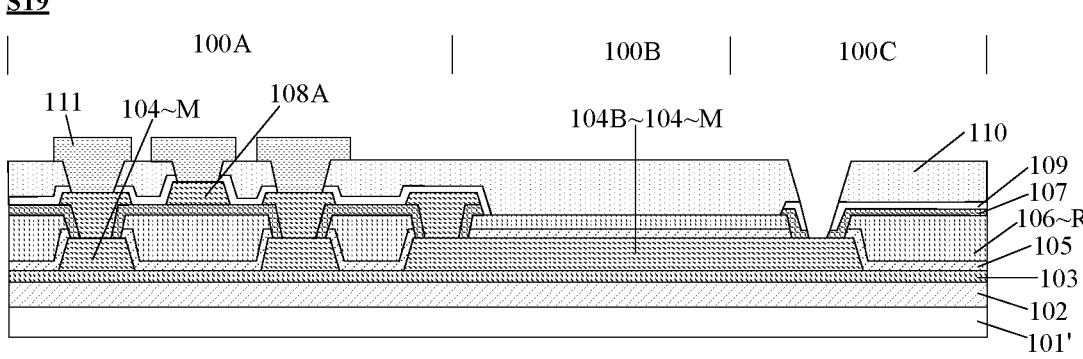
Figures 5, 6, 7, 8, 9, 10, 11:
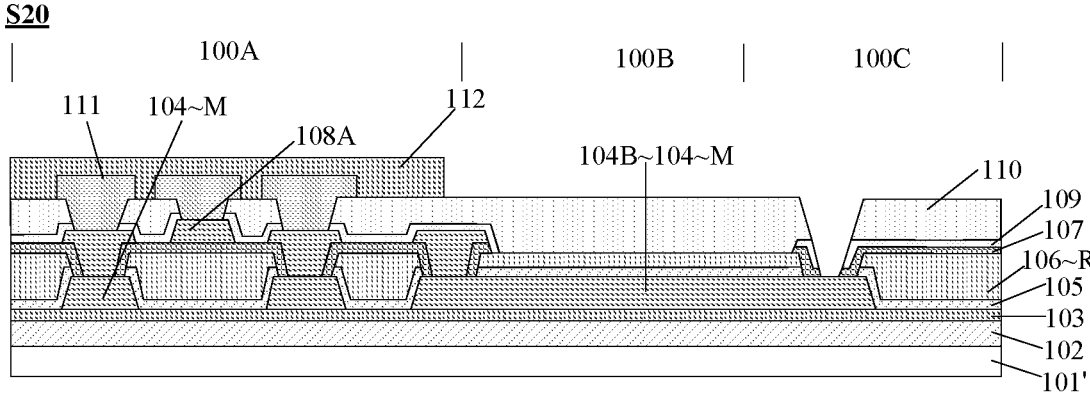
Figures 5, 6, 7, 8, 9, 10, 11, 12:
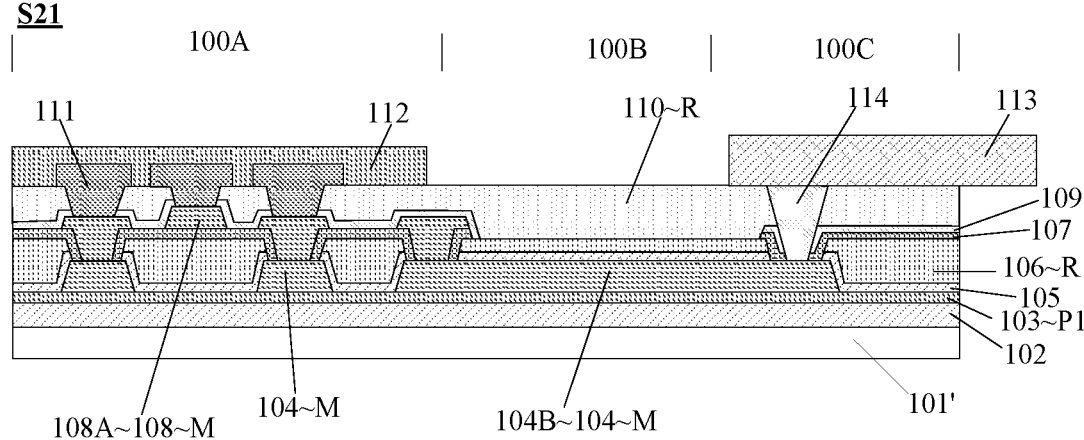

In some other examples, as shown in FIG. 12, the second metal intermediate layer 108 includes the sources and the drains 108A of the thin film transistors, and a second electrical structure 108B located at least in the bending region 1008. For example, the second metal intermediate layer 108 is a source-drain electrode layer.

For example, as shown in FIG. 12, the second electrical structure 108B includes a portion located in the light-emitting unit region 100A, a portion located in the bending region 1006, and a portion located in the bonding region 100C. For example, the portion included in the second electrical structure 108B that is located in the light-emitting unit region 100A is a portion of the data line, and the portions included in the second electrical structure 108B that are located in the bending region 100B and the bonding region 100C are portions of the second fan-out line.

For example, the second electrical structure 108B includes one or more of a portion of the data line located in the light-emitting unit region 100A, a portion of the power supply line located in the light-emitting unit region 100A, and portions of the second fan-out line located in the bending region 100B and the bonding region 100C.

The portions of the second fan-out line located in the bending region 100B and the bonding region 100C are used to electrically connect the portions of the electrical structure in the light-emitting unit region 100A and pin terminals in the bonding region 100C.

In some embodiments, as shown in FIGS. 4 and 12, the array substrate 100 further includes a first protection layer P1 and a second protection layer P2. The first protection layer P1 is located between the metal intermediate layer M and the first organic material layer 102, and the second protection layer P2 is located between the metal intermediate layer M and the second organic material layer R.

As shown in FIGS. 4, 5-15, in a case where the metal intermediate layer M includes the first metal intermediate layer 104, the first protection layer P1 includes a buffer layer 103, and the second protection layer P2 includes a first passivation layer 105. The gate of the thin film transistor (TFT) and the portion of the first electrical structure 104B located in the bending region 100B are disposed between the buffer layer 103 and the first passivation layer 105. The second organic material layer R is the second resin layer 110 or a combination of the first resin layer 106 and the second resin layer 110.

A material of the buffer layer 103 includes silicon oxynitride (SiON), silicon nitride (SiN), or silicon oxide (SiO$_2$). The buffer layer 103 is configured to enhance the adhesion between the metal intermediate layer M and the first organic material layer 102 while ensuring a reliability of subsequent processes.

A material of the first passivation layer 105 may be the same as the material of the buffer layer 103 to achieve a good effect of isolating moisture and oxygen, and perform insulation protection on metal materials adjacent thereto.

As shown in FIGS. 4 and 12, the array substrate 100 further includes: a first resin layer 106, a second passivation layer 107, a third passivation layer 109, and a second resin layer 110.

The first resin layer 106 is disposed on a side of the first passivation layer 105 away from the base substrate 101, and includes a portion located in the light-emitting unit region 100A, a portion located in the bending region 1006, and a portion located in the bonding region 100C. The second passivation layer 107 is disposed on a side of the first resin layer 106 away from the base substrate 101, and includes a portion located in the light-emitting unit region 100A and a portion located in the bonding region 100C. The sources and the drains 108A of the thin film transistors are disposed on a side of the second passivation layer 107 away from the base substrate 101. The third passivation layer 109 is disposed on the side of the second passivation layer 107 away from the base substrate 101, and includes a portion located in the light-emitting unit region 100A and a portion located in the bonding region 100C. The second resin layer 110 is disposed on a side of the third passivation layer 109 away from the base substrate 101, and includes a portion located in the light-emitting unit region 100A, a portion located in the bending region 100B, and a portion located in the bonding region 100C. The portion of the second resin layer 110 located in the bending region 100B is in contact with the portion of the first resin layer 106 located in the bending region 100B.

It will be noted that vent hole(s) are disposed in the second passivation layer 107, and are used to discharge gas in the first resin layer 106 during the manufacturing process, so as to avoid formation of bubbles and uneven thickness of the first resin layer 106. After a film layer made of a resin material is formed, gas will be generated in the film layer made of the resin material in a manufacturing process of the subsequent film layer(s). Therefore, by providing the vent hole(s) in the second passivation layer 107, the gas inside of the first resin layer 106 may be discharged.

For example, a diameter of the vent hole is 5 μm to 15 μm, such as 10 μm. The number of the vent holes is determined according to a contact area between the second passivation layer 107 and the first resin layer 106.

By adopting the above solution, the portion of the first electrical structure 104B located in the bending region 100B and the gates of the thin film transistors located in the light-emitting unit region 100A are disposed in a same layer, which may be formed through a same process without additional manufacturing processes. Thus, costs are lowered and an efficiency is improved. In addition, a portion of the first electrical structure 104B located in a non-bending region and the portion of the first electrical structure 104B located in the bending region 100B may also be formed in a same film forming process or different patterning processes.

In some embodiments, as shown in FIG. 6, in the bending region 100B, a thickness H2 of the first organic material layer 102 in a direction perpendicular to a plane where the base substrate 101 is located is equal or approximately equal to a thickness H1 of the second organic material layer R (i.e., the first resin layer 106 and the second resin layer 110) in the direction perpendicular to the plane where the base substrate 101 is located.

For example, the thickness H2 of the first organic material layer 102 is in a range of 3 μm to 10 μm, inclusive, such as 3 μm or 5 μm. The thickness H1 of the second organic material layer R is in a range of 2 μm to 6 μm, inclusive, such as 2 μm or 3 μm.

Figures 5, 6, 7, 8, 9, 10, 11, 12, 13:
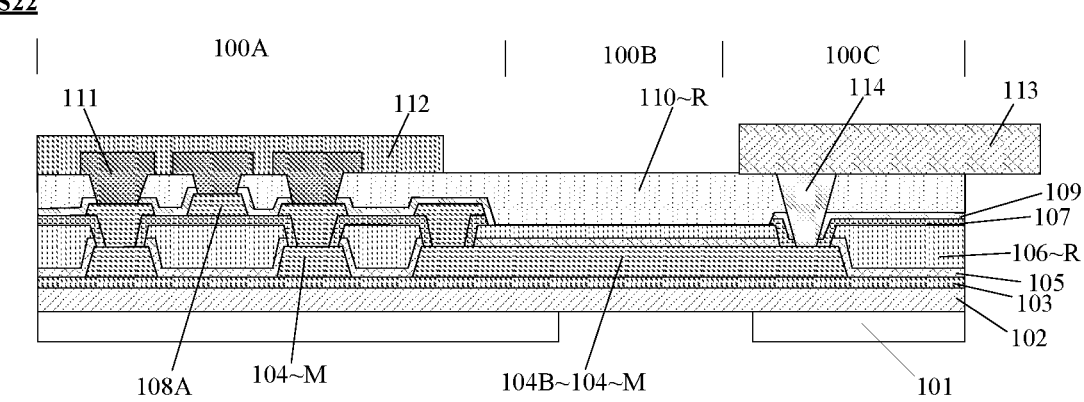
Figures 5, 6, 7, 8, 9, 10, 11, 12, 13, 14:
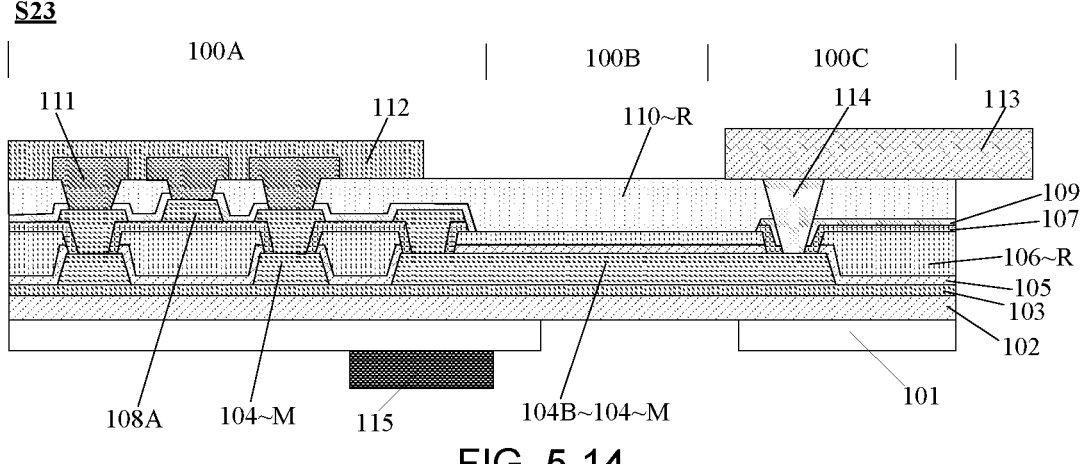

Further, as shown in FIGS. 6, 13 and 14, in the bending region 100B, a percentage difference between a sum of thicknesses of layers L1 on one side of the metal intermediate layer M (e.g., the first metal intermediate layer 104 or the second metal intermediate layer 108) in the direction perpendicular to the plane where the base substrate 101 is located and a sum of thicknesses of layers L2 on the other side of the metal intermediate layer M in the direction perpendicular to the plane where the base substrate 101 is located is less 30%.

For example, a thickness of the metal intermediate layer is in a range of 0.5 μm to 10 μm, inclusive, such as 0.7 μm or 0.9 μm. The thickness of each of the layers on both sides of the metal intermediate layer M is in a range of 2 μm and 4 μm. The thickness of the first organic material layer 102 is in a range of 3 μm to 10 μm, inclusive, such as 3 μm. A thickness of the buffer layer 103 is in a range of 0.05 μm to 0.35 μm, inclusive, such as 0.1 μm.

A thickness of the first passivation layer 105 is in a range of 0.05 μm to 0.35 μm, inclusive, such as 0.1 μm. A thickness of the first resin layer 106 is in a range of 0.8 μm to 2.5 μm, inclusive, such as 1.5 μm. A thickness of the second resin layer 110 is in a range of 2 μm to 6 μm, inclusive, such as 2 μm.

By controlling the thicknesses of the layers on both sides of the metal intermediate layer M in the bending region 100B to be approximately equal, the metal intermediate layer M may be located at the middle position of all the film layers, so that in the bending process, a tensile force exerted on the layers outside the metal intermediate layer M at the middle position counteracts an extrusion force exerted on the layers inside the metal intermediate layer M, so that the stress exerted on the metal intermediate layer M is minimized, the yield of the product is improved, and the service life of the product is improved.

As shown in FIG. 13, in a case where the metal intermediate layer M includes the second metal intermediate layer 108, the first protection layer P1 includes a second passivation layer 107, the second protection layer P2 includes a third passivation layer 109, and the sources and the drains of the thin film transistors (TFT) and the portion of the second electrical structure 108B located in the bending region 100B are disposed between the second passivation layer 107 and the third passivation layer 109.

As shown in FIG. 12, the array substrate 100 further includes the buffer layer 103, the gates of the thin film transistors, the first passivation layer 105, the first resin layer 106, the second passivation layer 107, the third passivation layer 109, and the second resin layer 110.

The buffer layer 103 is disposed between the first organic material layer 102 and the second passivation layer 107. The gate of the thin film transistor is disposed on a side of the buffer layer 103 away from the base substrate 101. The first passivation layer 105 is disposed on a side of the gate of the thin film transistor away from the buffer layer 103, and is located in the light-emitting unit region 100A. The first resin layer 106 is disposed on a side of the first passivation layer 105 away from the buffer layer 103, and includes a portion located in the light-emitting unit region 100A, a portion located in the bending region 100B, and a portion located in the bonding region 100C. The portion of the first resin layer 106 located in the bending region 100B is in contact with the buffer layer 103.

The second passivation layer 107 is disposed on a side of the first resin layer 106 away from the base substrate 101, and includes a portion located in the light-emitting unit region 100A and a portion located in the bending region 100B. The third passivation layer 109 includes a portion located in the light-emitting unit region 100A and a portion located in the bending region 100B. The second resin layer 110 is disposed on a side of the third passivation layer 109 away from the base substrate 101, and the second organic material layer R is the second resin layer 110.

The second passivation layer 107 and the third passivation layer 109 are both provided with vent holes therein, and at a position where the second passivation layer 107 and the third passivation layer 109 overlap, vent holes in the third passivation layer 109 are disposed corresponding to vent holes in the second passivation layer 107.

For example, a diameter of the vent hole is 5 μm to 15 μm, such as 10 μm. The number of vent holes is determined according to a contact area between the second passivation layer 107 and the first resin layer 106, and between the third passivation layer 109 and the first resin layer 106.

By adopting the above solution, the portion of the second electrical structure 108B located in the bending region 100B and the source and the drain located in the light-emitting unit region 100A are disposed in a same layer, which can be formed through a same process without additional manufacturing processes. Thus, the costs are lowered, and the efficiency is improved. In addition, a portion of the second electrical structure 108B located in a non-bending region (i.e., the bonding region) and the portion of the second electrical structure 108B located in the bending region 100B may be formed in a same film forming process or different patterning processes.

The beneficial effects that can be achieved by the above solution are the same as the beneficial effects that can be achieved by the above technical solution in which the metal intermediate layer M includes the first metal intermediate layer 104, which will not be described in detail herein.

It will be noted that FIG. 12 are schematic diagrams showing the structures of the film layers included in the array substrate 100 in a case where the metal intermediate layer M includes a film layer (i.e., the second metal intermediate layer 108) in the bending region 1008. In addition, film layer(s) of other metal materials in the array substrate 100 may be used to design functions of the metal intermediate layer M according to actual needs.

In some embodiments, as shown in FIGS. 4 and 5-15, the array substrate further includes a fixing adhesive 115. The fixing adhesive is disposed on a side of the base substrate 101 away from the first organic material layer 102.

In a case where the film layers of the array substrate 100 located in the bending region 100B are bent, the fixing adhesive is configured to adhesively fix a portion of the base substrate 101 located in the light-emitting unit region 100A and a portion of the base substrate 101 located in the bonding region 100C.

As shown in FIGS. 4 and 5-15, a is a size of a margin region where the light-emitting units 111 are fixed and encapsulated by the silica gel layer 112, for example, a is 20 μm. b is a bending radius of a portion of the array substrate 100 in the bending region 100B (the portion actually has an arc structure, and the figure is only for schematically showing the structural relationship, so the bending region 100B is not drawn in a circular arc shape), for example, b is 60 µm. c is a size of a comprehensive margin region of a thermal influence and alignment of the laser lift-off LLO and stealth dicing, and is 30 µm. It will be seen that the comprehensive margin region may overlap the margin region in a thickness direction of the array substrate 100, so a size of an actual bending frame of the array substrate 100 is 90 µm (i.e., a sum of b and c), which meets the technical requirements. FIG. 9 shows a back view of the array substrate 100 after bending and fixing (four sides of the array substrate 100 are all bent). Then, the array substrates 100 are tiled, as shown in FIG. 10, the tile seam d is equal to a sum of a sum of sizes (each is equal to (b+c)) of the single-sided bending frame of two adjacent array substrates 100 and a remaining tile seam between the two array substrates 100.

It will be understood that a method of bending opposite sides, adjacent sides, or three sides of the array substrate 100 may also be adopted. It will be seen that the size of the bending frame may within 90 µm by adopting the solution of the embodiments of the present disclosure, and compared with the side wiring solution, the TPV solution, and the sidewall deposition solution, the manufacturing difficulty is greatly reduced, and the yield is greatly improved simultaneously.

For the array substrate 100 provided in the above embodiments, a structure thereof in the bonding region 100C is similar to a structure thereof in the light-emitting unit region 100A, and there may be no electrical structure in a same layer as the gates or the sources and the drains 108A of the thin film transistors in the bonding region 100C. The control circuit is electrically connected to the first electrical structure 104B through an FPC connection adhesive 114. The control circuit includes one or more of an FPC 113 and a printed circuit board (PCB) that are connected to each other, or the FPC 113 and an IC or a COF that are connected to each other. As shown in FIG. 9, the control circuit includes the FPC, the COF, and the PCB.

It will be understood that connection modes and layouts of the PCB, the FPC and the COF are well-known technologies in the art, and will not be repeated here. The FPC connection adhesive is a conductive adhesive, such as anisotropic conductive paste (ACP).

Some embodiments of the present disclosure provide a manufacturing method for an array substrate 100 to manufacture the array substrate 100 described in any of the above embodiments. The array substrate 100 includes a light-emitting unit region 100A, a bonding region 100C, and a bending region 100B connected between the light-emitting to unit region 100A and the bonding region 100C. The light-emitting unit region 100A is configured to be provided with light-emitting units 111, and the bonding region 100C is configured to bond a control circuit.

In some embodiments, as shown in FIGS. 5-1 to 5-15, the method will be described by taking an example in which a metal intermediate layer M of the array substrate 100 includes a first metal intermediate layer 104 (e.g., a gate metal layer). As shown in FIG. 11, the method includes steps 10 to 23 (S10 to S23).

In S10, as shown in FIG. 5-1, a base substrate to be processed 101' is provided, and a first organic material layer 102 is formed on a side of the base substrate to be processed 101'.

The base substrate to be processed 101' is made of a rigid material, for example, it may be one of quartz, glass, silicon dioxide, silicon, plastic, or polymethyl methacrylate.

The first organic material layer 102 is usually made of polyimide (PI). PI material with a thickness of 3 to 4 µm is manufactured by a spin coating process.

In S11, as shown in FIG. 5-2, a first protection layer P1 is formed on a side of the first organic material layer 102 away from the base substrate to be processed 101'. The first protection layer P1 includes a buffer layer 103.

A material of the buffer layer 103 includes silicon oxynitride (SiON), silicon nitride (SiN), or silicon oxide (SiO2). The buffer layer 103 is configured to enhance an adhesion between the metal intermediate layer M and the first organic material layer 102 while ensuring a reliability during subsequent bending. In addition, it is found by a test that a bending effect may be ensured when a thickness of the buffer layer 103 is approximately 1000 angstroms (A) to 2000 A.

In S12, as shown in FIG. 5-3, a first metal intermediate layer 104 is formed on a side of the first protection layer P1 away from the base substrate to be processed 101'. The light-emitting unit region 100A is provided with thin film transistors (TFTs). The first metal intermediate layer 104 includes gates of the thin film transistors (TFTs) and a first electrical structure 104B.

The first electrical structure 104B includes a portion located in the light-emitting unit region 100A, a portion located in the bending region 100B, and a portion located in the bonding region 100C.

For example, a metal film layer is formed on the side of the first protection layer P1 away from the base substrate to be processed 101', and the metal film layer is patterned by an etching process to form the gates of the thin film transistors (TFTs) and the first electrical structure 1046.

It will be noted that, currently, two processes are generally used to manufacture gates of thin film transistors (TFTs) and a first electrical structure to form a two-layer stacked structure.

Compared with the above solution, the gates of the thin film transistors (TFTs) and the first electrical structure 104B in the embodiments of the present disclosure are disposed in a same layer, which can be made of a same material and formed through a same process without additional preparation processes. Thus, costs are lowered, and the efficiency is improved. In addition, a portion of the first electrical structure 104B located in a non-bending region (i.e., the bonding region) and a portion of the first electrical structure 104B located in the bending region 100B are formed in a same film forming process or different patterning processes.

In S13, as shown in FIG. 5-4, a second protection layer P2 is formed on a side of the first metal intermediate layer 104 away from the base substrate to be processed 101'. The second protection layer P2 is, for example, a first passivation layer 105. A portion of the first passivation layer 105 located in the light-emitting unit region 100A and a portion of the first passivation layer 105 located in the bonding region 100C are etched to form via holes to expose the first metal intermediate layer 104.

In S14, as shown in FIG. 5-5, a first resin layer 106 is formed on a side of the first passivation layer 105 away from the base substrate to be processed 101'. A portion of the first resin layer 106 located in the bending region 100B is in contact with the first passivation layer 105.

In S15, as shown in FIG. 5-6, a second passivation layer 107 is formed on a side of the first resin layer 106 away from the base substrate to be processed 101'. The second passivation layer 107 is located in the light-emitting unit region 100A and the bonding region 100C, for example, a portion of a film layer forming the second passivation layer 107 located in the bending region 100B is removed. In addition, via holes are formed through etching in the portions of the second passivation layer 107 in the light-emitting unit region 100A and the bonding region 100C. A plurality of vent holes (not shown in the figure) are formed in the second passivation layer 107, and a diameter of the vent hole is, for example, 10 μm.

Alternatively, a mask may be used when the second passivation layer 107 is deposited, so that the second passivation layer 107 is not formed in the bending region 1006.

In S16, as shown in FIG. 5-7, a source-drain metal layer is formed on a side of the second passivation layer 107 away from the base substrate to be processed 101'. The source-drain metal layer is configured to form sources and drains 108A of the thin film transistors.

In S17, as shown in FIG. 5-8, a third passivation layer 109 is formed on a side of the source-drain metal layer away from the base substrate to be processed 101'. A portion of a film layer forming the third passivation layer 109 located in the bending region 100B is removed.

In S18, as shown in FIG. 5-9, a second resin layer 110 is formed on a side of the third passivation layer 109 away from the base substrate to be processed 101'. A portion of the second resin layer 110 located in the bending region 100B is in contact with the first resin layer 106. A portion of the second resin layer 110 located in the light-emitting unit region 100A is etched to form via holes to expose the sources and the drains 108A of the thin film transistors.

In S19, as shown in FIGS. 5-10, in the light-emitting unit region 100A, a plurality of light-emitting units 111 are provided on a side of the second resin layer 110 away from the base substrate to be processed 101'. The plurality of light-emitting units 111 are micro LEDs or mini LEDs, and are disposed on the array substrate 100 through a mass transfer process. The plurality of light-emitting units 111 are each electrically connected to the source or the drain 108A of the thin film transistor through a via hole.

In S20, as shown in FIG. 5-11, in the light-emitting unit region 100A, a silica gel layer 112 is formed on the plurality of light-emitting units 111. The silica gel layer 112 is configured to encapsulate and protect the light-emitting units 111 and bond the FPC to the bonding region 100C.

In S21, as shown in FIG. 5-12, an FPC connection adhesive 114 is provided in the bonding region 100C to bond an FPC 113.

In S22, as shown in FIG. 5-13, a portion of the base substrate to be processed 101' located in the bending region 100B is removed to obtain a base substrate 101. An etching process, such as a laser process or a knife wheel process, is used in the removal method.

It will be noted that a first bending region W1 is a bending region proximate to a source driver, and a second bending region W2 is a bending region proximate to a gate driver.

In a case where the first bending region W1 and the second bending region W2 are located on adjacent sides of the array substrate 100, there is a bending overlapping region DR between the first bending region W1 and the second bending region W2. As shown in FIG. 7, a knife wheel process is used to remove all film layers on a side of the first organic material layer 102 in the bending overlapping region DR away from the base substrate to be processed 101', and then a laser process is used to remove a portion of the base substrate to be processed 101' in the bending overlapping region DR, so as to facilitate portions of the array substrate 100 in the bending of the first bending region W1 and the second bending region W2.

In a case where the first bending region W1 and the second bending region W2 are disposed on opposite sides of the array substrate 100, as shown in FIG. 8, there is only a need to use a laser process to remove a portion of the base substrate to be processed 101' in first bending region W1 and the second bending region W2.

In S23, as shown in FIG. 5-14, a fixing adhesive 115 is provided on a side of the base substrate 101 away from the first organic material layer 102. Film layer of the array substrate 100 located in the bending region 100B are bent, and a portion of the base substrate 101 located in the light-emitting unit region 100A and a portion of the base substrate 101 located in the bonding region 100C are adhesively fixed to form a structure as shown in FIG. 5-15.

In some other embodiments, the method will be described by taking an example in which a metal intermediate layer M of the array substrate 100 includes a second metal intermediate layer 108. The method includes steps 10 to 23 (S10 to S23).

Figures 5, 6, 7, 8, 9, 10, 11, 12, 13, 14, 15:
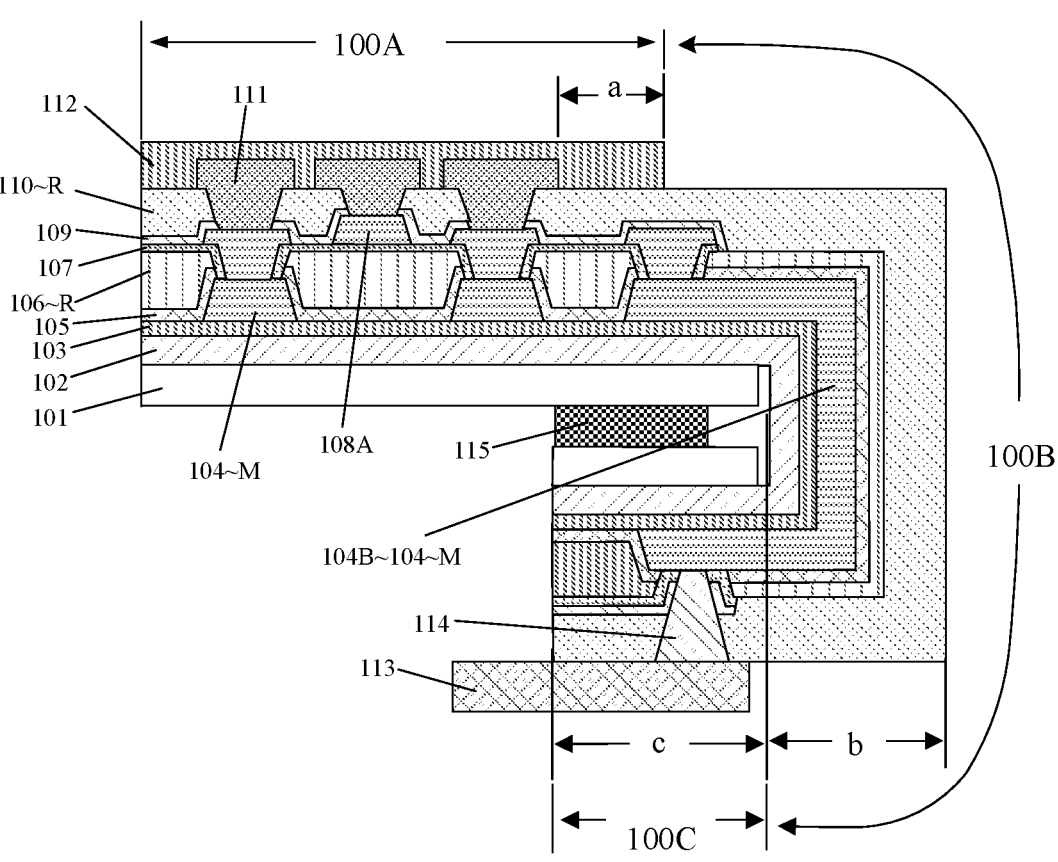
Figures 6, 7:
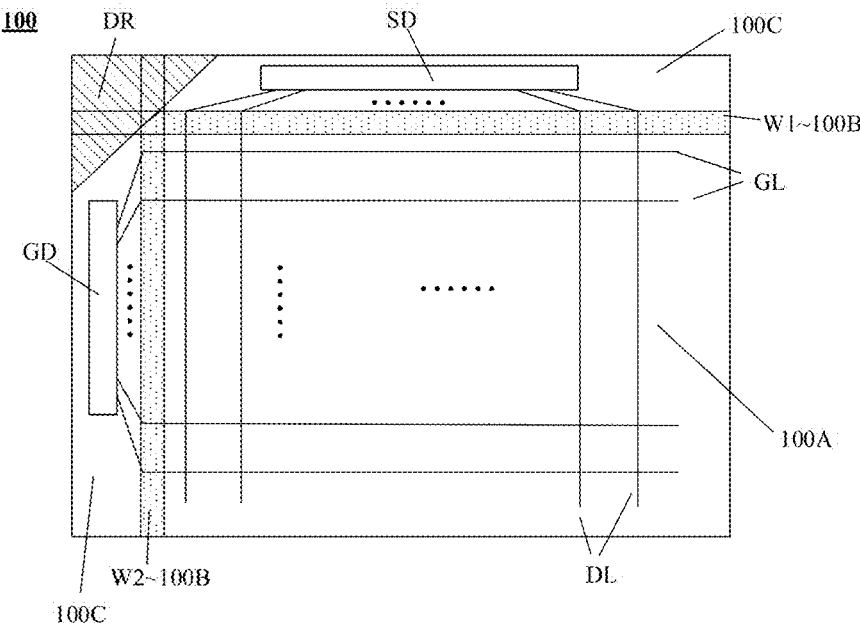
Figure 8:
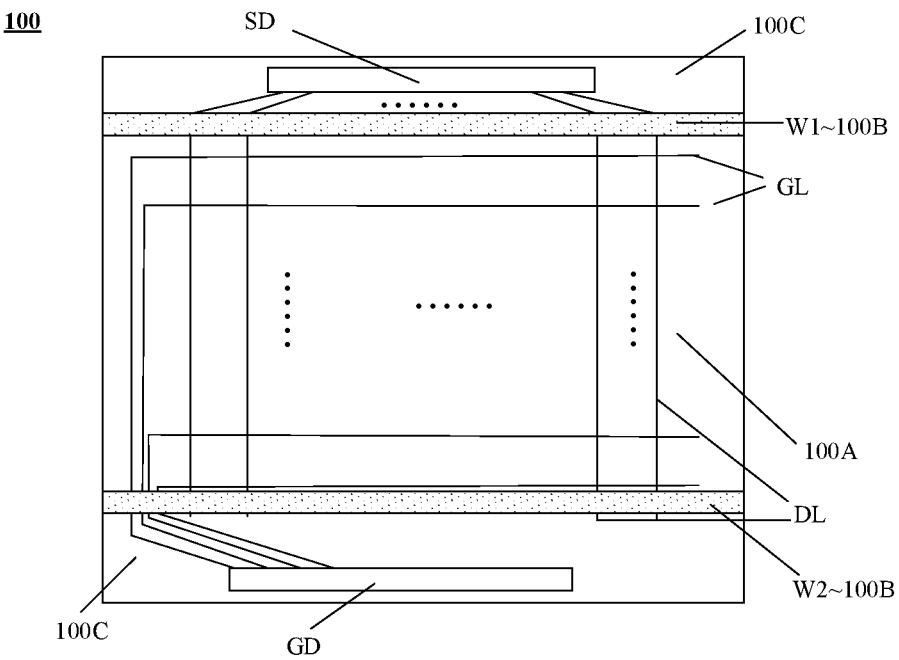
Figure 9:
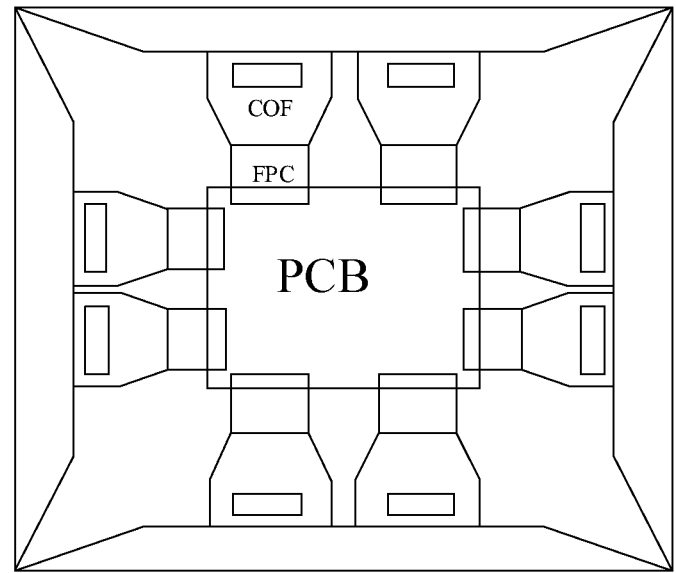
Figure 12:
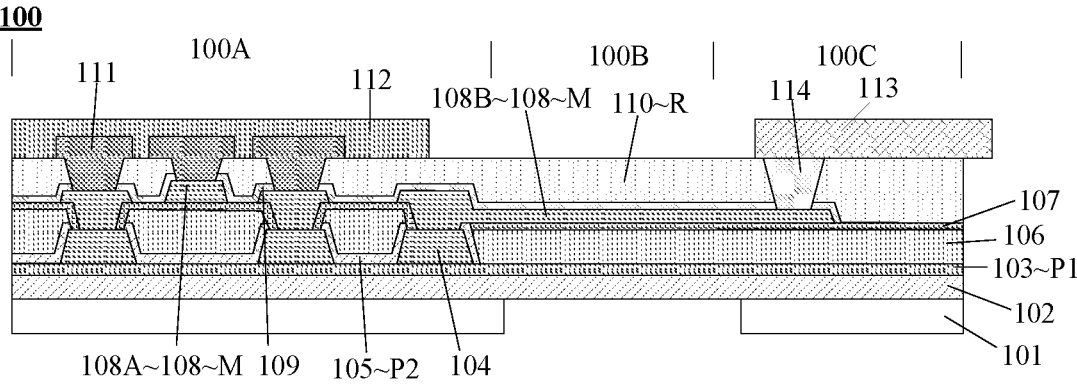
Figure 13:
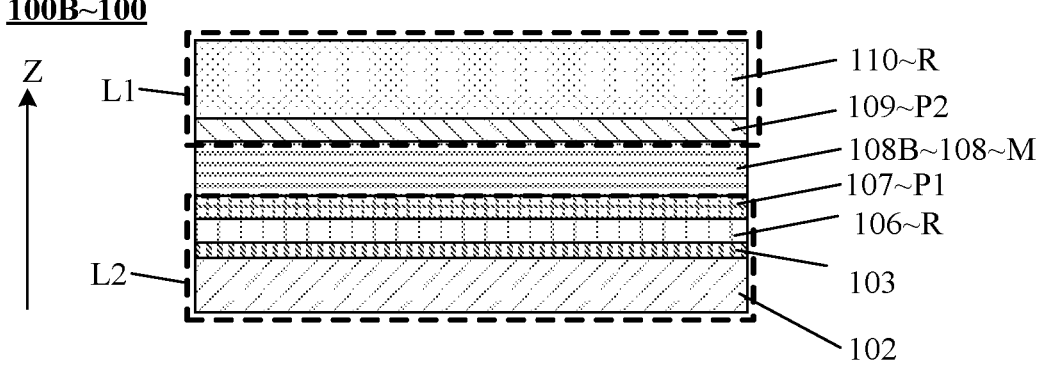
Figure 14:
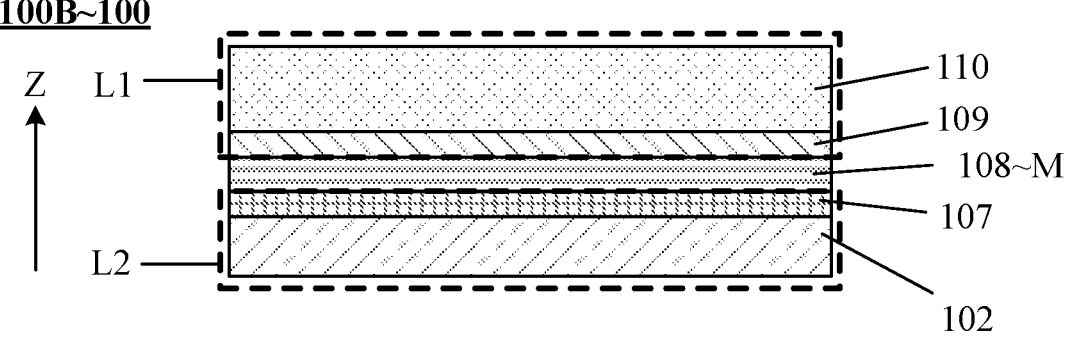

In S10, as shown in FIG. 15, a base substrate to be processed 101' is provided, and a first organic material layer 102 is formed on a side of the base substrate to be processed 101'.

The base substrate to be processed 101' is made of a rigid material, for example, it may be one of quartz, glass, silicon dioxide, silicon, plastic, or polymethyl methacrylate.

The first organic material layer 102 is usually made of polyimide (PI), which is formed through a spin coating process.

In S11, as shown in FIG. 15, a buffer layer 103 is formed on a side of the first organic material layer 102 away from the base substrate to be processed 101'.

A material of the buffer layer 103 includes silicon oxynitride (SiON), silicon nitride (SiN), or silicon oxide (SiO2). The buffer layer 103 is configured to enhance an adhesion between the metal intermediate layer M and the first organic material layer 102 while ensuring a reliability of subsequent processes.

In S12', as shown in FIGS. 12 and 15, a gate metal layer is formed on a side of the first organic material layer 102 away from the base substrate to be processed 101'. The gate metal layer is located in the light-emitting unit region 100A, and includes gates of thin film transistors.

In S13', as shown in FIGS. 12 and 15, a second protection layer P2 is formed on a side of the gate metal layer away from the base substrate to be processed 101'. The second protection layer P2 includes a first passivation layer 105. A portion of a film layer forming the first passivation layer 105 located in the bending region 100B is removed, and via holes are formed in a portion of the first passivation layer 105 that is located in the light-emitting unit region 100A and corresponds to the gates of the thin film transistors.

In S14', as shown in FIGS. 12 and 15, a first resin layer 106 is formed on a side of the first passivation layer 105 away from the base substrate to be processed 101'. A portion of the first resin layer 106 located in the bending region 100B is in contact with the buffer layer 103.

In S15', as shown in FIGS. 12 and 15, a second passivation layer 107 is formed on a side of the first resin layer 106 away from the base substrate to be processed 101'.

A plurality of vent holes (not shown in the figure) are formed in the second passivation layer 107, and a diameter of the vent hole is approximately 10 μm, so as to well discharge the gas generated in the first resin layer 106.

Alternatively, a mask may be used when the second passivation layer 107 is deposited, so that the second passivation layer 107 is not formed in the bending region 1006.

In S16', as shown in FIGS. 12 and 15, a second metal intermediate layer 108 is formed on a side of the second passivation layer 107 away from the base substrate to be processed 101'. The second metal intermediate layer 108 is configured to form sources and drains 108A of the thin film transistors and a second electrical structure 108B. A portion of the second electrical structure 108B located in the bending region 100B is used to provide a bending rigidity of a bending portion of the array substrate 100.

In S17', as shown in FIGS. 12 and 15, a third passivation layer 109 is formed on a side of the second metal intermediate layer 108 away from the base substrate to be processed 101'. A portion of the third passivation layer 109 located in the light-emitting unit region 100A is etched to form via holes to expose the sources and the drains 108A of the thin film transistors. A portion of the third passivation layer 109 located in the bonding region 100C is etched to form a via hole to expose a portion of the second electrical structure 108B located in the bonding region 100C.

In S18', as shown in FIGS. 12 and 15, a second resin layer 110 is formed on a side of the third passivation layer 109 away from the base substrate to be processed 101'. A portion of the second resin layer 110 located in the bending region 100B is in contact with the first resin layer 106. A portion of the second resin layer 110 located in the light-emitting unit region 100A is etched to form via holes to expose the sources and the drains 108A of the thin film transistors. A portion of the second resin layer 110 located in the bonding region 100C is etched to form a via hole to expose a portion of the second electrical structure 108B located in the bonding region 100C.

In S19', as shown in FIGS. 12 and 15, in the light-emitting unit region 100A, a plurality of light-emitting units 111 are provided on a side of the second resin layer 110 away from the base substrate to be processed 101'. The plurality of light-emitting units 111 are micro LEDs or mini LEDs, and are disposed on the array substrate 100 through a mass transfer process. The plurality of light-emitting units 111 are each electrically connected to the source or the drain 108A of the thin film transistor through a via hole.

In S20', as shown in FIGS. 12 and 15, in the light-emitting unit region 100A, a silica gel layer 112 is formed on the plurality of light-emitting units 111. The silica gel layer 112 is configured to encapsulate and protect the light-emitting units 111 and bond the FPC to the bonding region 100C.

In S21', as shown in FIGS. 12 and 15, an FPC connection adhesive 114 is provided in the bonding region 100C to bond an FPC 113. The FPC 113 is electrically connected to the portion of the second electrical structure 108B located in the bonding region 100C through the FPC connection adhesive 114.

In S22, as shown in FIGS. 12 and 15, a portion of the base substrate to be processed 101' located in the bending region 100B is removed to obtain a base substrate 101. An etching process, such as a laser process or a knife wheel process, is used in the removal method. The base substrate 101 in the bonding region 100C is not removed, so that the binding and alignment between the bonding region 100C and the light-emitting unit region 100A are convenient and tight.

In S23, as shown in FIG. 15, a fixing adhesive 115 is formed on a side of the base substrate 101 away from the first organic material layer 102. Film layer of the array substrate 100 located in the bending region 100B are bent, and a portion of the base substrate 101 located in the light-emitting unit region 100A and a portion of the base substrate 101 located in the bonding region 100C are adhesively fixed.

Compared with a case where bending is performed before bonding in the prior art, processes of bonding the FPC before bending in the present disclosure avoids cumbersome processes of bonding processing on the back of the array substrate 100, which is simple and reliable.

In yet other embodiments, the manufacturing method for the array substrate will be described by taking an example in which a metal intermediate layer M of the array substrate 100 includes a first metal intermediate layer 104 and a second metal intermediate layer 108. The first metal intermediate layer 104 is configured to form gates of thin film transistor(s) and a first electrical structure 104B. The second metal intermediate layer 108 is configured to form sources and drains 108A of the thin film transistor(s) and a second electrical structure 1086.

The manufacturing method for each film layer of the array substrate 100 is the same as the step of the corresponding film layer in the above embodiments, which can be adaptively combined, and will not be repeated here.

The foregoing descriptions are only preferred embodiments of the present disclosure and explanations of the principles of the technology employed. It will be appreciated by those skilled in the art that the scope of the present disclosure is not limited to the technical solutions formed by particular combinations of technical features described above, but also encompasses other technical solutions formed by any combination of the technical features described above or equivalents thereof without departing from the concept of the present disclosure, for example, the technical solutions formed by replacing the above features and the technical features disclosed in the present disclosure (but not limited to) having similar functions.

What is claimed is:

1. An array substrate having a light-emitting unit region, a bonding region, and a bending region located between the light-emitting unit region and the bonding region; the light-emitting unit region being configured to be provided with light-emitting units, and the bonding region being configured to bond a control circuit;

the array substrate comprising:

a base substrate located in the light-emitting unit region and the bonding region;

a first organic material layer disposed on a side of the base substrate;

a metal intermediate layer disposed on a side of the first organic material layer away from the base substrate;

a second organic material layer disposed on a side of the metal intermediate layer away from the base substrate;

a first protection layer located between the metal intermediate layer and the first organic material layer; and a second protection layer located between the metal intermediate layer and the second organic material layer;

wherein in the bending region, a thickness of the first organic material layer in a direction perpendicular to a plane where the base substrate is located is approximately equal to a thickness of the second organic material layer in the direction perpendicular to the plane where the base substrate is located.

2. The array substrate according to claim 1, wherein the base substrate is made of a rigid material.

3. The array substrate according to claim 2, wherein the light-emitting unit region is provided with at least one thin film transistor therein, a thin film transistor includes a source, a drain, and a gate; and the metal intermediate layer includes:

a first metal intermediate layer including the gate of the thin film transistor, and a first electrical structure located at least in the bending region; and/or a second metal intermediate layer including the source and the drain of the thin film transistor, and a second electrical structure located at least in the bending region.

4. The array substrate according to claim 3, wherein the metal intermediate layer includes the first metal intermediate layer including the gate of the thin film transistor and the first electrical structure located at least in the bending region, the first electrical structure includes a portion located in the light-emitting unit region, a portion located in the bending region, and a portion located in the bonding region.

5. The array substrate according to claim 4, wherein the portion included in the first electrical structure that is located in the light-emitting unit region includes a portion of a gate line located in the light-emitting unit region or a portion of a power supply line located in the light-emitting unit region, and the portions included in the first electrical structure that are located in the bending region and the bonding region include portions of a first fan-out line located in the bending region and the bonding region.

6. The array substrate according to claim 3, wherein the metal intermediate layer includes the second metal intermediate layer including the source and the drain of the thin film transistor, and the second electrical structure located at least in the bending region, the second electrical structure includes a portion located in the light-emitting unit region, a portion located in the bending region, and a portion located in the bonding region.

7. The array substrate according to claim 1, wherein the light-emitting unit region is provided with at least one thin film transistor therein, a thin film transistor includes a source, a drain, and a gate, the metal intermediate layer includes a first metal intermediate layer including the gate of the thin film transistor, and a first electrical structure located at least in the bending region, the first protection layer includes a buffer layer;

the second protection layer includes a first passivation layer; and the gate of the thin film transistor and a portion of the first electrical structure located in the bending region are disposed between the buffer layer and the first passivation layer;

the array substrate further comprises:

a first resin layer disposed on a side of the first passivation layer away from the base substrate, the first resin layer including a portion located in the light-emitting unit region, a portion located in the bending region, and a portion located in the bonding region;

a second passivation layer disposed on a side of the first resin layer away from the base substrate, the second passivation layer including a portion located in the light-emitting unit region and a portion located in the bonding region, wherein the source and the drain of the thin film transistor are disposed on a side of the second passivation layer away from the base substrate;

a third passivation layer disposed on a side of the second passivation layer away from the base substrate, the third passivation layer including a portion located in the light-emitting unit region and a portion located in the bonding region; and a second resin layer disposed on a side of the third passivation layer away from the base substrate, the second resin layer including a portion located in the light-emitting unit region, a portion located in the bending region, and a portion located in the bonding region, wherein the portion of the second resin layer located in the bending region is in contact with the portion of the first resin layer located in the bending region; wherein the second organic material layer is the second resin layer or a combination of the first resin layer and the second resin layer.

8. The array substrate according to claim 1, wherein the light-emitting unit region is provided with at least one thin film transistor therein, a thin film transistor includes a source, a drain, and a gate, the metal intermediate layer includes a second metal intermediate layer including the source and the drain of the thin film transistor, and a second electrical structure located at least in the bending region, the first protection layer includes a second passivation layer;

the second protection layer includes a third passivation layer; and the source and the drain of the thin film transistor and a portion of the second electrical structure located in the bending region are disposed between the second passivation layer and the third passivation layer;

the array substrate further comprises:

a buffer layer disposed between the first organic material layer and the second passivation layer; wherein the gate of the thin film transistor is located on a side of the buffer layer away from the base substrate;

a first passivation layer disposed on a side of the gate of the thin film transistor away from the buffer layer, and the first passivation layer including a portion located in the light-emitting unit region;

a first resin layer disposed on a side of the first passivation layer away from the buffer layer, and the first resin layer including a portion located in the light-emitting unit region, a portion located in the bending region, and a portion located in the bonding region; and the portion of the first resin layer located in the bending region being in contact with the buffer layer; and a second resin layer disposed on a side of the third passivation layer away from the base substrate, wherein the second passivation layer is disposed on a side of the first resin layer away from the base substrate, and includes a portion located in the light-emitting unit region and a portion located in the bending region; the third passivation layer includes a portion located in the light-emitting unit region and a portion located in the bending region; and the second organic material layer is the second resin layer.

9. The array substrate according to claim 1, wherein in the bending region, a percentage difference between a sum of thicknesses of layers on one side of the metal intermediate layer in the direction perpendicular to the plane where the base substrate is located and a sum of thicknesses of layers on another side of the metal intermediate layer in the direction perpendicular to the plane where the base substrate is located is less 30%.

10. The array substrate according to claim 1, further comprising a fixing adhesive, wherein the fixing adhesive is disposed on a side of the base substrate away from the first organic material layer;

in a case where film layers of the array substrate located in the bending region being bent, the fixing adhesive is configured to adhesively fix a portion of the base substrate located in the light-emitting unit region and a portion of the base substrate located in the bonding region.

11. A manufacturing method for an array substrate, the array substrate having a light-emitting unit region, a bonding region, and a bending region located between the light-emitting unit region and the bonding region, wherein the light-emitting unit region is configured to be provided with light-emitting units, and the bonding region is configured to bind a control circuit; and the method comprises:

providing a base substrate to be processed;

forming a first organic material layer on a side of the base substrate to be processed;

forming a metal intermediate layer on a side of the first organic material layer away from the base substrate to be processed;

forming a second organic material layer on a side of the metal intermediate layer away from the base substrate to be processed; and removing a portion of the base substrate to be processed located in the bending region to obtain a base substrate;

wherein in the bending region, a thickness of the first organic material layer in a direction perpendicular to a plane where the base substrate is located is approximately equal to a thickness of the second organic material layer in the direction perpendicular to the plane where the base substrate is located;

wherein before forming the metal intermediate layer on the side of the first organic material layer away from the base substrate to be processed, the method further comprises:

forming a first protection layer on a side of the first organic material layer away from the base substrate to be processed; and before forming the second organic material layer on the side of the metal intermediate layer away from the base substrate to be processed, the method further comprises:

forming a second protection layer on a side of the metal intermediate layer away from the base substrate to be processed.

12. The manufacturing method for the array substrate according to claim 11, wherein the light-emitting unit region is provided with at least one thin film transistor therein;

forming the metal intermediate layer on the side of the first organic material layer away from the base substrate to be processed includes:

forming a first metal intermediate layer on the side of the first organic material layer away from the base substrate to be processed, wherein the first metal intermediate layer includes a gate of a thin film transistor and a first electrical structure; and/or forming a second metal intermediate layer on the side of the first organic material layer away from the base substrate to be processed, wherein the second metal intermediate layer including a source and a drain of the thin film transistor, and a second electrical structure; wherein the first electrical structure includes a portion located in the light-emitting unit region, a portion located in the bending region, and a portion located in the bonding region, and the second electrical structure includes a portion located in the light-emitting unit region, a portion located in the bending region, and a portion located in the bonding region.

13. The manufacturing method for the array substrate according to claim 11, further comprising:

providing a fixing adhesive on a side of the base substrate away from the first organic material layer; and bending film layers of the array substrate located in the bending region, and adhesively fixing a portion of the base substrate located in the light-emitting unit region and a portion of the base substrate located in the bonding region.

14. A light-emitting substrate, comprising:

the array substrate according to claim 1; and a plurality of light-emitting units provided on the array substrate, the plurality of light-emitting units being located in the light-emitting unit region and on a side of the second organic material layer away from the base substrate.

15. The light-emitting substrate according to claim 14, wherein the light-emitting units include micro light-emitting diode chips.

16. A display device, comprising a light-emitting substrate, wherein the light-emitting substrate comprises:

the array substrate according to claim 1; and a plurality of light-emitting units provided on the array substrate, the plurality of light-emitting units being located in the light-emitting unit region and on a side of the second organic material layer away from the base substrate.

17. The array substrate according to claim 6, wherein the portion included in the second electrical structure that is located in the light-emitting unit region includes a portion of a data line located in the light-emitting unit region or a portion of a power supply line located in the light-emitting unit region, and the portions included in the second electrical structure that are located in the bending region and the bonding region include portions of a second fan-out line located in the bending region and the bonding region.

* * * * *